(12) United States Patent
Hasegawa et al.

(10) Patent No.: US 6,452,274 B1
(45) Date of Patent: Sep. 17, 2002

(54) SEMICONDUCTOR DEVICE HAVING A LOW DIELECTRIC LAYER AS AN INTERLAYER INSULATING LAYER

(75) Inventors: Toshiaki Hasegawa; Hajime Nakayama, both of Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/192,335

(22) Filed: Nov. 16, 1998

(30) Foreign Application Priority Data

| Nov. 17, 1997 | (JP) | P09-315682 |
| Feb. 19, 1998 | (JP) | P10-037673 |
| Apr. 20, 1998 | (JP) | P10-109983 |

(51) Int. Cl.$^7$ .................. H01L 51/40; H01L 23/485; H01L 29/40; H01L 29/06
(52) U.S. Cl. .................. 257/758; 257/759; 257/760; 257/700; 257/701; 257/774; 257/643; 257/642; 257/748; 257/750; 257/3
(58) Field of Search ............... 257/643, 642, 257/759, 758, 700, 701, 750, 774, 748, 3

(56) References Cited

U.S. PATENT DOCUMENTS

| 5,661,344 A | * | 8/1997 | Havemann et al. | 257/758 |
| 5,704,067 A | * | 1/1998 | Colgan et al. | 349/114 |
| 5,717,251 A | * | 2/1998 | Hayashi et al. | 257/758 |
| 5,744,865 A | * | 4/1998 | Jeng et al. | 257/750 |
| 5,804,508 A | * | 9/1998 | Gnade et al. | 438/778 |
| 5,818,111 A | * | 10/1998 | Jeng et al. | 257/776 |
| 5,824,599 A | * | 10/1998 | Schazhom-Diemand et al. | 438/678 |
| 5,858,869 A | * | 1/1999 | Chen et al. | 438/597 |
| 5,936,295 A | * | 8/1999 | Havemann et al. | 257/760 |
| 6,008,540 A | * | 12/1999 | Lu et al. | 257/758 |
| 6,037,668 A | * | 3/2000 | Cave et al. | 257/758 |
| 6,043,146 A | * | 3/2000 | Watanabe et al. | 438/623 |
| 6,046,503 A | * | 4/2000 | Weigand et al. | 257/758 |
| 6,054,769 A | * | 4/2000 | Jeng | 257/758 |
| 6,149,778 A | * | 11/2000 | Jin et al. | 204/192.22 |
| 6,184,121 B1 | * | 2/2001 | Buchwalter et al. | 257/522 |
| 6,208,030 B1 | * | 3/2001 | Tsui et al. | 257/758 |
| 6,245,672 B1 | * | 6/2001 | Hong et al. | 438/648 |

* cited by examiner

Primary Examiner—Alexander O. Williams
(74) Attorney, Agent, or Firm—Rader, Fishman & Grauer PLLC; Ronald P. Kananen, Esq.

(57) ABSTRACT

A semiconductor device including a semiconductor substrate, an insulating layer formed on the substrate, a dielectric organic layer formed on the insulating layer and having a dielectric constant of not more than 3.0, and an interconnection layer in contact with the insulating layer in the dielectric organic layer, wherein the upper surface of the interconnection layer is formed higher than the upper surface of the dielectric organic layer, and a method of manufacture thereof.

20 Claims, 22 Drawing Sheets

SEMICONDUCTOR DEVICE HAVING A LOW DIELECTRIC LAYER AS AN INTERLAYER INSULATING LAYER

BACKGROUND OF THE INVENTION

1. Field of the Invention

The present invention relates to a semiconductor device having a low dielectric layer as an inter-layer insulating layer and method of manufacturing a semiconductor device having that structure, more particularly relates to technology for formation of multilayer interconnections able to be used for under 0.25 μm rule device processes.

2. Description of the Related Art

Recently, increasingly fine interconnections and reduced interconnection pitches have been demanded along with the increasing miniaturization of semiconductor devices. Further, increasingly lower dielectric rates have been demanded for inter-layer insulating layers along with demands for lower power consumption and higher speeds. In particular, in logic type devices, a rise in resistance due to finer interconnections and an increase in the capacitance of the interconnections leads to a reduction in the speed of the device, so finer multilayer interconnections having low dielectric layers as inter-layer insulating layers have become essential.

Increasing finer interconnection widths and reduced pitches, however, not only increase the ratio of the length and width of the interconnections themselves, but also increase the aspect ratio of the spaces between the interconnections and, as a result, place an additional burden on the formation of longitudinally narrow, fine interconnections, the burying of the fine spaces between interconnections by inter-layer layers, etc. and therefore both complicate the process and increase the number of process steps.

To solve this problem, there is known the so-called "damascene" process of simultaneously burying the contact holes and interconnection grooves by aluminum reflow sputtering and then smoothing the surface aluminum by chemical mechanical smoothing (CMP).

The damascene process does not require the forming of high aspect ratio aluminum interconnections by etching or burying of the narrow spaces between interconnections by an inter-layer insulating layer, so can greatly reduce the number of process steps. In this process, the higher the aspect ratio of interconnections and the greater the total number of interconnections, the greater the contribution to the reduction of the total cost. Further, reduction of the dielectric rate of the inter-layer insulating film can be expected to reduce the capacitance of the space between interconnections.

However, films comprised of materials with small dielectric constants differ tremendously in nature from the silicon oxide films used in conventional devices. No process technology has yet been developed for them. Therefore, practical technology for this is now being sought.

Further, in recent years, use of xerogel as a material in semiconductor devices is being closely examined as it promises a dielectric constant of less than 2.0.

In relation to this art, Japanese Unexamined Patent Publication (Kokai) No. 8-70005 discloses a structure, as shown in FIG. 9, providing dummy leads 93 for dispersing heat in a low dielectric material 96 as a method of increasing the reliability of metal leads 94. This structure is comprised of a substrate 92 on which are provided metal leads 94 made of an aluminum alloy etc., a low dielectric material 96 comprised of a space, silica-airogel, organic SOG, fluorine doped silicon oxide, etc. at least between the metal leads 94, a heat conductive insulating layer 97 comprised of a laminate of AlN, $Si_3N_4$, and AlN deposited on the metal leads 94 and the low dielectric material 96, and dummy leads 93 comprised of an aluminum alloy etc. adjacent to the metallic leads 94.

In this structure, the heat from the metal leads 94 can move to the dummy leads 93 which are able to disperse the heat and to the heat conductive insulating layer 97 which is made of an insulating material such as AlN having a heat conductivity 20% higher than the low dielectric material, preferably a heat conductivity 20% higher than that of $Si_3N_4$. By structuring the device in this way, it is possible to reduced the interconnection capacitance between lines (or leads) and, along with the fall in the heat conductivity of the low dielectric material, prevent damage to the metal leads by the Joule's heat effect, which becomes a problem when using metal leads with a high aspect ratio, and thereby obtain a semiconductor device having more reliable metal leads.

Turning now to the problems to be solved by the present invention, the above-mentioned damascene method forms the interconnection layer in advance on the inter-layer insulating layer, then buries this with a metal and polishes the metal by CMP to form the interconnections. With conventional inter-layer insulating layers, use has been made of an inorganic material such as a silicon oxide film. Use is now however being made of materials with low dielectric rates with the object of suppressing an increase in capacitance along with miniaturization. Most materials with low dielectric rates are organic. Organic films have a hardness of ⅒ to ¹⁄₁₀₀ that of the conventional silicon oxide and other inorganic films and therefore lack the hardness required for the damascene process.

That is, most substances with low dielectric constants, in particular low dielectric films with dielectric constants less than 3, are also organic. Organic films are softer than the silicon oxide films used for conventional inter-layer insulating layers. For example, compared by Young's modules, a silicon oxide has a value of $5 \times 10^{10}$, while a resin used for an organic film has a small value of 0.3 to $0.8 \times 10^{10}$.

Therefore, when forming interconnections by the damascene method, many scratches are formed on the organic film. These scratches cause lower product yield. Therefore, the general practice has been to form a silicon oxide layer or nitride layer on the organic film, but these layers have a higher dielectric rate than the organic film, so there was the problem that the capacitance between interconnections ended up increasing.

Therefore, the idea has been proposed of making joint use of a silicon oxide film and a silicon nitride film at the time of the damascene process. These films, however, have high dielectric rates and therefore had the problem of halving the effect of reduction of the dielectric rate by the organic film.

Further, an organic film has a very small heat conductivity of about ⅒ that of the inter-layer insulating layer (silicon oxide layer) used for conventional semiconductor devices and therefore had a serious effect on the dispersion of the heat of the elements. That is, while the amount of heat generated per unit area falls along with the reduction in size of a device, the heat conductivity of the paths for radiation of that heat has been falling as well.

Therefore, a structure of a device giving due consideration to the paths for heat dispersion is desired.

Xerogel is a well-known substance, for example, used as a desiccant under the name of "silica gel". Use for a semiconductor device however would be difficult as things now stand due to the various requirements on reliability. That is, xerogel is comprised of 50% to 90% by volume and therefore suffers from problems in mechanical strength, heat conductivity, heat resistance, moisture resistance, inter-layer adhesion, etc.

Accordingly, a structure of a device which solves the above mentioned problem and enables use of xerogel with its low dielectric constant is desired.

SUMMARY OF THE INVENTION

An object of the present invention is to provide a semiconductor device using a low dielectric film as an inter-layer insulating layer and a method of manufacturing the same.

The present inventors, in consideration of the above problems, invented a semiconductor device having an organic layer as a low dielectric layer or an organic layer containing xerogel as an inter-layer insulating layer and formed by the damascene method and a method of manufacturing the same.

That is, according to the present invention, there is provided a semiconductor device having a semiconductor substrate, an insulating layer formed on the semiconductor substrate, a first dielectric layer having a dielectric constant of not more than 3.0, and an interconnection layer formed in the dielectric layer in contact with the insulating layer, wherein the upper surface of the interconnection layer is higher than the upper surface of the dielectric layer.

The present invention also provides a method of manufacturing a semiconductor device which has the steps of forming an insulating layer on a semiconductor substrate, forming a dielectric layer having a dielectric constant of not more than 3.0 on the insulating layer, forming an inorganic layer on the dielectric layer, forming a pattern on the dielectric layer for forming an interconnection, forming an interconnection layer over the entire surface, smoothing the interconnection layer, and removing the inorganic layer.

In the semiconductor device and method of manufacturing the same of the present invention, the dielectric layer is preferably an organic layer comprised of at least one material selected from the group comprising a cyclic fluororesin, polytetrafluoroethylene, a fluorinated ethylene propylene, a copolymer of tetrafluoroethylene and perfluoroalkoxyethylene, polyfluorovinylidene, polytrifluorochloroethylene, a fluoroaryl ether resin, polyfluoroimide, benzocyclobutene (BCB) polymer, polyimide, amorphous carbon, a monomethyltrihydroxysilane (organic SOG) condensate, a polymer having a repeating structural unit in its molecule of:

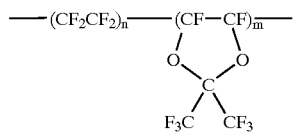

where, m and n each represents a natural number,
a polymer having a repeating structural unit in its molecule of

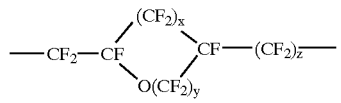

where, x, y and z each represents a natural number,
a polymer having a repeating structural unit in its molecule of

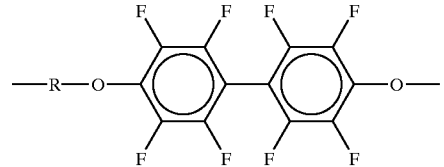

where, R represents an alkylene or a phenylene group,
and a polymer having a repeating structural unit in its molecule of

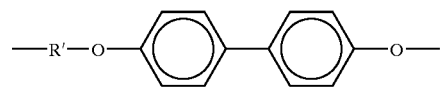

where, R' represents an alkylene or a phenylene group,
Additionally, the above low dielectric layer may be made of material available commercially under the brand names Amorphous Teflon, CYTOP (phonetic), and Flare.

The semiconductor device of the present invention preferably has a dummy interconnection at a portion of an interconnection space of at least three times the pitch in the interconnection pattern, more preferably so all of the interconnection spaces are not more than 1 μm.

The semiconductor device of the present invention preferably has an inter-layer insulating layer containing xerogel on the dielectric layer, more preferably has a layer containing a silane coupling agent on the inter-layer insulating layer containing xerogel.

Further, the semiconductor device preferably has a dummy contact hole in the insulating layer under the dummy interconnection not connected with a lower conductive layer.

As the lower conductive layer, an impurity diffusion region provided in the semiconductor substrate or a lower interconnection layer may be mentioned.

In the method of manufacturing a semiconductor device of the present invention, the inorganic layer is preferably a layer comprised of at least one material selected from the group consisting of a silicon oxide, fluorine doped silicon oxide, silicon nitride, silicon oxynitride, a silanol condensate (inorganic SOG), phosphorus-doped silicon oxide, boron-doped silicon oxide, and boron-phosphorus-doped silicon oxide.

The method of manufacturing a semiconductor device of the present invention preferably has a step of forming a dummy interconnection at a portion of an interconnection space of at least three times the pitch in the interconnection pattern, more preferably so all of the interconnection spaces are not more than 1 μm.

The step of forming the dummy interconnection preferably is a step of simultaneously forming a pattern for forming an interconnection and for forming a dummy interconnection in a portion of an interconnection space of at least three times the pitch in the interconnection pattern, more preferably so all of the interconnection spaces are not more than 1 µm.

The step of smoothing the interconnection layer is preferably a step of smoothing by CMP.

As explained in detail above, the present invention relates to a semiconductor device having an organic layer having a low dielectric constant or xerogel formed by the damascene method and a method of manufacturing the same.

The damascene method forms the interconnection pattern in advance on an inter-layer insulating layer, buries this with a metal, then uses CMP (chemical mechanical smoothing) to polish the metal and form the interconnection layer.

Until now, hard materials such as silicon oxide have been used for inter-layer insulating layers. Organic layers are now however coming into use as low dielectric materials for the purpose of suppressing the increase in capacitance accompanying the increasing miniaturization of semiconductor devices.

However, organic layers differ tremendously in nature from inorganic layers of silicon oxide etc. For example, they lack the hardness necessary for the damascene process. The value is said to be 1/10 to 1/100 the same. Therefore, in the present invention, it was conceived to first form an inorganic layer on the organic layer, then form the interconnection layer in the organic layer by the damascene method and then remove the inorganic layer.

On the other hand, an organic layer has a low heat conductivity, so the dispersion of the heat at the time of operation of the device became a problem. Therefore, in the present invention, a method of manufacturing a semiconductor device including forming a path for radiating the heat, that is, a dummy interconnection, by the damascene method in the process for formation of interconnections was devised.

Further, the present invention proposes a new structure for increasing the heat radiating effect by forming a dummy contact hole under the dummy interconnection not connected with the lower conductive layer when forming contact holes for connecting the lower conductive layer and upper interconnections.

Further, the present invention conceived of application of a xerogel layer, now being researched as a low dielectric layer, to the process of formation of interconnections. A xerogel layer is a low dielectric layer, but is inferior to conventional inter-layer insulating layers in terms of mechanical strength, heat conductivity, adhesion, waterproofness, etc. Therefore, in the present invention, the structure was devised of reducing the locations of use of the xerogel as much as possible and combining a low dielectric layer with an inorganic insulating layer so as to reduce the capacitance between interconnections without detracting from the effect of the low dielectric layer. That is, xerogel is used only at parts where the interconnection capacitance would become the greatest, while an other low dielectric layers than xerogel are used at other locations.

In addition, in consideration of the fact that a xerogel layer is inferior in inter-layer adhesion, the present invention proposes providing a film formed from a silane coupling agent below and/or above the xerogel layer.

According to the present invention, since the inter-layer insulating layer is made of a dielectric layer having a dielectric constant of not more than 3.0 (hereinafter referred to as a "low dielectric layer"), it is possible to manufacture a miniature semiconductor device where the increase in capacitance between interconnections is greatly suppressed.

Further, when providing a dummy interconnection for radiating heat at a portion of an interconnection space of at least three times the pitch in the interconnection pattern, it is possible to effectively prevent a reduction in the heat dispersion efficiency due to the use of a low dielectric layer with a small heat conductivity.

When providing a dummy contact hole under the dummy interconnection layer, it is possible to further improve the heat dispersion effect.

Further, according to the present invention, by using a layer containing xerogel, with its extremely small dielectric constant, around an interconnection (left and right of interconnection), preferably at locations of an interconnection space not more than three times the standard pitch, and by using a low dielectric layer around a contact hole between interconnections (above and below interconnection layers), it is possible to cover up defects in the xerogel layer and greatly reduce the interconnection capacitance and therefore possible to manufacture a highly reliable semiconductor device of a miniature structure with a good product yield.

Further, by providing a layer comprised of a silane coupling agent above and below the layer containing xerogel, it is possible to manufacture a semiconductor device superior in inter-layer adhesion.

BRIEF DESCRIPTION OF THE DRAWINGS

These and other objects and features of the present invention will be more apparent from the following description of the preferred embodiments given with reference to the accompanying drawings, in which:

FIGS. 2A to 2J are cross-sectional views illustrating the main steps of a method of manufacturing a semiconductor device according to a second embodiment of the present invention, wherein FIG. 2A shows the formation of a silicon oxide layer on a silicon semiconductor substrate, FIG. 2B shows the formation of a p-well region, FIG. 2C shows the patterning for formation of element isolation regions after formation of the p-well region, FIG. 2D shows the formation of element isolation regions by LOCOS (local oxidation of silicon) after the pattern for formation of element isolation regions, FIG. 2E shows formation of a silicon oxide layer, then formation of gate electrodes and formation of n+ regions and p+ regions, FIG. 2F shows formation of a low dielectric layer over the entire surface after formation of the n+ regions and p+ regions, FIG. 2G shows formation of a silicon oxide layer and patterning for forming interconnections after formation of the low dielectric layer over the entire surface, FIG. 2H shows photoetching for formation of interconnection grooves and contact holes after patterning for forming interconnections, FIG. 2I shows deposition of aluminum over the entire surface and formation of interconnections by CMP after patterning for formation of interconnections and then photoetching for formation-of interconnection grooves and contact holes, and FIG. 2J shows formation of a passivation layer over the entire surface after formation of interconnections;

FIGS. 3A to 3F are cross-sectional views illustrating the main steps of a method of manufacturing a semiconductor device according to a third embodiment of the present invention, wherein FIG. 3A shows formation of a silicon oxide layer on a silicon semiconductor substrate, formation of a low dielectric layer on top of this, and then formation of a silicon oxide layer on top of the same, FIG. 3B shows patterning for interconnections using a resist layer after formation of the silicon oxide layer, FIG. 3C shows photoetching for formation of contact holes after the patterning for interconnections, FIG. 3D shows deposition of copper over the entire surface after formation of the contact holes, FIG. 3E shows formation of interconnections by CMP after deposition of the copper, and FIG. 3F shows formation of a low dielectric layer as a passivation layer;

FIGS. 4A to 4I are cross-sectional views illustrating the main steps of a method of manufacturing a semiconductor device according to a fourth embodiment of the present invention, wherein FIG. 4A shows formation of a silicon oxide layer on a silicon semiconductor substrate, formation of a low dielectric layer, then formation of interconnections and dummy interconnections and formation of a second low dielectric layer, FIG. 4B shows use of a resist for formation of contact holes by photoetching after formation of the second low dielectric layer, FIG. 4C shows burying the contact holes with a metal (W) after formation of the contact holes, FIG. 4D shows formation of a silicon nitride layer over the entire surface after burying the contact holes, FIG. 4E shows use of a resist for patterning for formation of a second interconnection layer after formation of the silicon nitride layer, FIG. 4F shows photoetching for formation of the second interconnection layer after the patterning for formation of the second interconnection layer, FIG. 4G shows formation of an aluminum layer over the entire surface after formation of the second interconnection layer, FIG. 4H shows formation of the second metal interconnections by CMP after formation of the aluminum layer over the entire surface, and FIG. 4I formation of a passivation layer after formation of the second metal interconnections;

FIGS. 5A to 5F are cross-sectional views illustrating the main steps of a method of manufacturing a semiconductor device according to a fifth embodiment of the present invention, wherein FIG. 5A shows formation of contact plugs on a semiconductor substrate, then formation of a low dielectric layer, FIG. 5B shows formation of a first interconnection layer and then formation of an inorganic layer on it, FIG. 5C shows formation of a second low dielectric layer, FIG. 5D shows formation of second contact holes in the second low dielectric layer (organic layer), FIG. 5E shows formation of a layer containing xerogel and then formation of a second interconnection layer, and FIG. 5F shows formation of a passivation layer;

FIGS. 6A to 6F are cross-sectional views illustrating the main steps of a method of manufacturing a semiconductor device according to a sixth embodiment of the present invention, wherein FIG. 6A shows formation of an element isolation layer on a semiconductor substrate and formation of an inter-layer insulating layer, FIG. 6B shows formation of a resist layer over the entire surface and patterning for formation of contact holes and dummy contact holes, FIG. 6C shows burying by a metal material and formation of contact plugs and dummy contact plugs, FIG. 6D shows formation of a low dielectric organic layer and formation of an inorganic layer on it, FIG. 6E shows formation of a resist layer over the entire surface, then patterning for formation of a first interconnection and dummy interconnection layer, and FIG. 6F shows formation of the first interconnection layer;

FIGS. 7A to 7F are cross-sectional views illustrating the main steps of a method of manufacturing a semiconductor device according to a seventh embodiment of the present invention, wherein FIGS. 7A to 7F are cross-sectional view which illustrates main steps of the seventh example, FIG. 7A shows formation of a second low dielectric layer, FIG. 7B shows formation of an inorganic layer, then formation of a resist layer over the entire surface, then patterning for formation of via contact holes and dummy via contact holes, FIG. 7C shows formation of via contact plugs and dummy via contact plugs, FIG. 7D shows formation of a third low dielectric layer and formation of an inorganic layer on it, FIG. 7E shows formation of a resist layer, then patterning for formation of a second interconnection and dummy interconnection layer, and FIG. 7F shows formation of the second interconnection and dummy interconnection layer;

FIGS. 8A to 8C are cross-sectional views illustrating the main steps of a method of manufacturing a semiconductor device according to an eighth embodiment of the present invention, wherein FIG. 8A shows formation of a first interconnection layer, FIG. 8B shows formation of an inorganic layer, then formation of a resist layer over the entire surface, then patterning for formation of a dummy interconnection layer, and FIG. 8C shows formation of the dummy interconnection layer.

DESCRIPTION OF THE PREFERRED EMBODIMENTS

Figure 1:
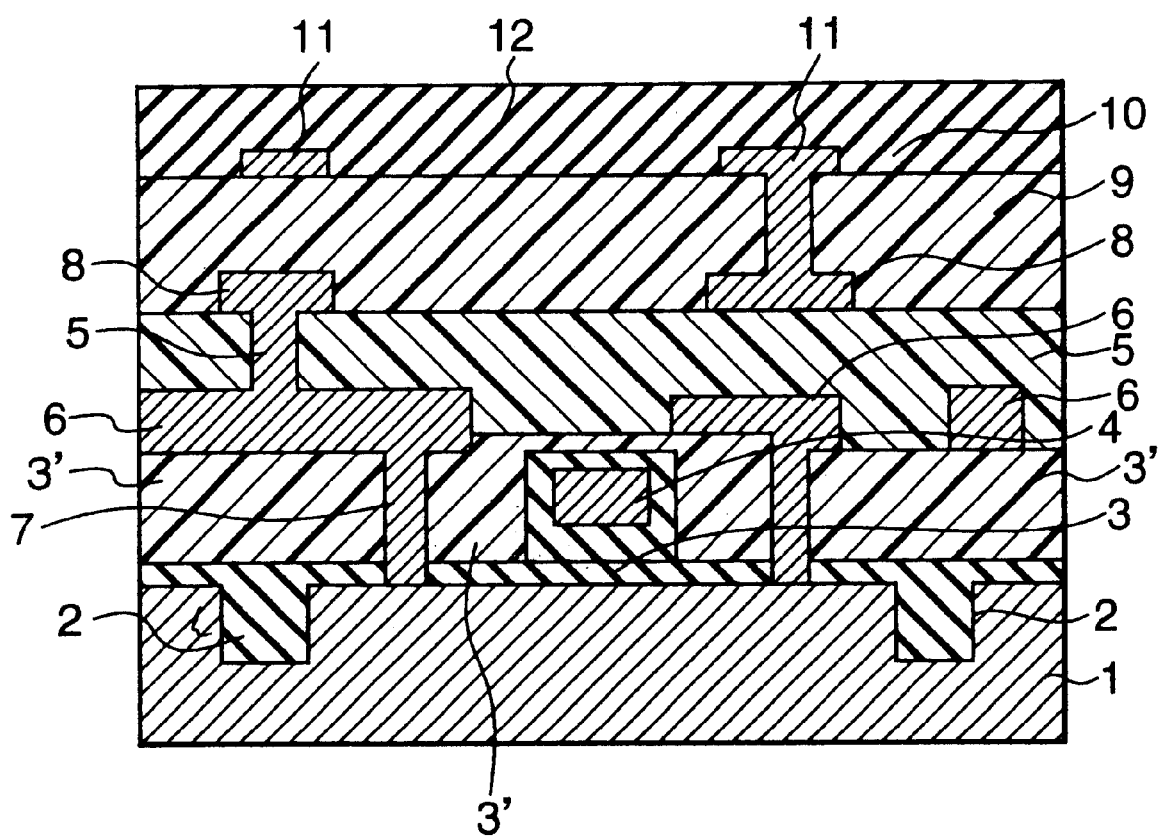
FIG. 1 is a cross-sectional view of a semiconductor device according to a first embodiment of the present invention.

The present invention will be explained in further detail below.

The present invention may use as a semiconductor substrate a silicon semiconductor substrate in which are implanted n-type or p-type impurities in which transistors, interconnection patterns, etc. are formed.

In the present invention, an insulating layer is provided on the semiconductor substrate. As the insulating layer, for example, a silicon oxide layer may be used. The insulating layer may be formed for example by a thermal oxidation method, CVD (chemical vapor deposition) method, sputtering method etc. and preferably has a thickness of about 300 to 700 nm.

A low dielectric layer is formed on the insulating layer. The low dielectric layer preferably has a dielectric constant of not more than 3.0. As the low dielectric layer, for example, a dielectric layer having a dielectric constant of not more than 3.0, a layer containing xerogel, etc. may be used.

The dielectric layer can be formed, for example, by forming a precursor of the polymer by a spin coater and then baking at 300 to 500° C. In the case of a material such as amorphous carbon, the dielectric layer may be formed by using acetylene or, if necessary, a fluorocarbon gas and using a plasma enhanced CVD system. The thickness of the organic layer is usually preferably 300 to 700 nm. The layer containing xerogel can be formed, for example, by a spin coating method.

In the present invention, the layer containing xerogel is preferably formed on an organic layer. Xerogel is a gel in a dry state. For example, silica gel may be mentioned. More specifically, there is the gel of the brandname Nanoporous Silica developed by Nanoglass Co. and a kind of porous silica. The present invention is not particularly limited to this. Any xerogel is possible so long as it is obtained by coating a silanol resin having aromatic or other relatively polymer alkyl groups, gelling the same, then hydrophobicizing the same using a silane coupling agent or hydrogenation. Xerogel is a material which can give a dielectric constant of not more than 2.0 and can greatly reduce the capacitance between interconnections.

In the present invention, the layer containing xerogel may be formed on the low dielectric layer, preferably on the low dielectric layer at a region of an interconnection space of not more than three times the pitch. More preferably, the layer containing xerogel is formed so as to bury the left and right of the interconnections.

Alternatively, particularly, a semiconductor device having a plurality of interconnection layers preferably is structured having contact holes for connecting interconnections in the dielectric layer having a dielectric constant of not more than 3.0.

By configuring the semiconductor device in this way, it is possible to reduce the locations of use of the layer containing xerogel as much as possible and combine an organic layer with a low dielectric rate and a layer containing xerogel so as to reduce the capacitance between interconnections while making up the above defect of a xerogel layer and without detracting from the effect of the low dielectric layer.

In addition, in the present invention, the layer containing xerogel is poor in inter-layer adhesion. Therefore, to increase the inter-layer adhesion, it is preferable to form a layer containing a silane coupling agent on the layer containing xerogel. As the silane coupling agent, for example, a silicon compound of the general formula $RSiX_3$ or $RR'SiX_2$ (where R and R' each represents an alkyl group, alkoxy group, etc. and X represents a halogen atom) can be exemplified. The silicon compound has a hydrophobic moiety R and R' and polar (hydrophilic) moiety (X) in the molecule and has the role of increasing the inter-layer adhesion between the hydrophobic organic layer and the polar layer containing xerogel to prevent peeling.

The silane coupling agent layer can be formed, for example, by spin-coating.

Next, an inorganic layer is formed on the dielectric layer, and/or a layer containing xerogel, and or a layer containing a silane coupling agent. Example materials of the inorganic layer, layer include a silicon oxide, fluorine doped silicon oxide, silicon oxynitride, silanol condensate (inorganic SOG), phosphorus-doped silicon oxide, boron-doped silicon oxide, boron-phosphorus-doped silicon oxidem etc.

The inorganic layer is normally formed by plasma enhanced CVD, but this has to be conducted in a reducing atmosphere. If performing the CVD in an oxidizing atmosphere, the organic layer will be oxidized and the phenomena of peeling etc. will occur, so this is not preferred. For example, in the case of a silicon oxide layer, this can be formed using a plasma enhanced CVD system in an atmosphere of silane gas and $N_2O$ gas at a temperature of 300 to 500° C.

After forming the inorganic layer, a resist layer is formed and the interconnections patterned. Then photoetching is used to etch the topmost inorganic layer, the layer containing the silane coupling agent, the layer containing xerogel, and the organic layer by for example a general magnetron reactive ion etching system. The etching can be performed using $C_2F_6$, CO, Ar, and $O_2$ as etching gases in the case of an inorganic layer of silicon oxide etc.

In the case of the organic layer, the etching can be performed using, for example, $CHF_3$ and $O_2$ as etching gases at a low temperature of about −10° C. In this case, the upper inorganic layer also serves as a mask when etching the low dielectric layer. Further, the resist layer is also etched under conditions for etching the organic layer.

Next, the interconnection layer is formed by the damascene method. The material of the interconnection layer, may include one or more of the materials selected from the group comprising aluminum, copper, gold, tungsten, and alloys of the same. The interconnection material may be formed, for example, by sputtering or the CVD method.

Next, the smoothing, such as CMP is used to polish off the excess metal. The smoothing agent may be, for example, alumina, manganese dioxide, silica based slurry, tungsten oxide having a general formula of $W_xO_y$, cesium oxide, zirconium oxide, or silicon oxide. If necessary, the smoothing agent may be mixed with hydrogen peroxide, potassium hydroxide, ammonia, etc.

After smoothing the metal completely, CMP is used to polish about 50 nm of the inorganic layer to remove scratches in the inorganic layer.

Next, for example, using $C_2F_6$ as a source of fluorine, CO, and argon gas, the inorganic layer, the layer containing a silane coupling agent, and the layer containing xerogel are etched. The organic layer is not etched much at all under these conditions.

Using the above operation, when not using a layer containing xerogel, a structure may be obtained where the upper surface of the interconnection layer becomes higher than the upper surface of the dielectric layer. The upper surface of the interconnection layer becomes higher than the upper surface of the dielectric layer is due to removal of the inorganic layer by etching at the end.

In the present invention, further, it is preferable to form a dummy interconnection at a portion of an interconnection space of at least three times the pitch in the interconnection pattern, more preferably so all of the interconnection spaces are not more than 1 μm.

When there is a portion of a space of at least three times the pitch in the interconnection pattern of the semiconductor device, since use is made of an organic layer having a small heat conductivity, an organic layer, and a layer having xerogel, there is no path for radiation of the heat generated at the time of operation, so the semiconductor device having the miniaturized structure malfunctions.

On the other hand, it is also possible to provide a dummy interconnection at a space of less than three times the pitch, but the interconnection structure would become finer and the effect of provision of the dummy interconnection would become weaker.

Here, the "pitch" means the distance between the center of one interconnection and the center of the adjoining intersection in the design of interconnections. A semiconductor device has interconnections formed at a certain pitch, but there are locations in other parts of the semiconductor device where the distance between interconnections is more than three times the pitch. In general, an organic layer or layer containing xerogel has an extremely low heat conductivity of about 1/10 that of the silicon oxide layer conventionly used as an inter-layer insulating layer. Therefore, the present invention disperses the heat by forming a dummy interconnection pattern at a portion of an interconnection space of at least three times the pitch in the interconnection pattern.

It is preferable from the manufacturing process that the dummy interconnection be formed in the same way as forming a normal interconnection by simultaneously patterning a dummy interconnection when patterning the interconnection.

Next, the substrate is washed, then, in the case of multilayer interconnections, a second dielectric layer is formed to a thickness of 200 to 400 nm. As this dielectric layer, for example, in addition to silicon oxide, silicon nitride, and silicon nitride, an organic layer comprised of the above-mentioned materials, a layer containing xerogel, etc. may be mentioned, but to reduce the capacitance of the semiconductor, use of an organic layer and a layer containing xerogel is preferred.

Next, a second interconnection layer is formed in the same way as the above, then the above operation is repeated to finally cover the upper layer by a passivation layer, whereby the interconnections are completed.

The method of manufacturing a semiconductor device of the present invention manufactured as explained above may be particularly preferably applied to the manufacture of a semiconductor device having a multilayer interconnection structure.

Next, a semiconductor device of the present invention and a method of manufacturing the same will be explained in more detail by embodiments.

First Embodiment

FIG. 1 is a cross-sectional view of a semiconductor device according to a first embodiment of the present invention. The semiconductor device is a n-channel type MOS transistor having a two-layer interconnection structure.

The semiconductor device has a p-type silicon semiconductor substrate 1 on which are formed isolation regions comprised of a silicon oxide layer 2 by the trench method. In the regions are source and drain regions in which not shown n-type impurities are doped by ion implantation. A gate electrode 4 comprised of polycrystalline silicon is formed on the semiconductor substrate at the center through a gate oxide layer 3. The gate electrode 4 is connected with a not shown gate. On top of this is provided an inter-layer insulating film 5 comprised of a low dielectric layer having a dielectric constant of not more than 3.0.

Next, an interconnection layer 6 comprised of aluminum is formed on top of this. The interconnection layer 6 comprises a normal interconnection and dummy interconnection for dispersing heat—not differentiated from each other in the figure for convenience sake. The dummy interconnection is formed at a portion of an interconnection space of at least three times the pitch in the interconnection pattern. The interconnections are connected with the source and drain regions though contact holes 7.

In the semiconductor device, the height of the upper surface of the interconnections is formed slightly higher than the height of the upper surface of the dielectric layer 5 due to the removal of the oxide layer.

Next, a second interconnection layer 8 is provided on the low dielectric layer 5. In addition, a second low dielectric layer 9 comprised of silicon nitride is provided on top of this. Further, a third interconnection layer 11 is formed on this through contact holes 10. Finally, a passivation layer 12 is formed on top of this.

The semiconductor device according to the first embodiment uses a dielectric layer having a dielectric constant of not more than 3.0 for the inter-layer insulating layer, so the semiconductor device can have a miniature multilayer structure where the increase in capacitance between interconnections is suppressed.

Further, by providing dummy interconnections for dispersing heat at portions of an interconnection space at least three times the pitch in the interconnection pattern, it is possible to effectively prevent a reduction in the heat dispersion efficiency due to the use of the low dielectric layer with its small heat conductivity.

Second Embodiment

The second embodiment shows a method of manufacturing a semiconductor device of the present invention—in this case a CMOS integrated circuit.

Figure 2A:
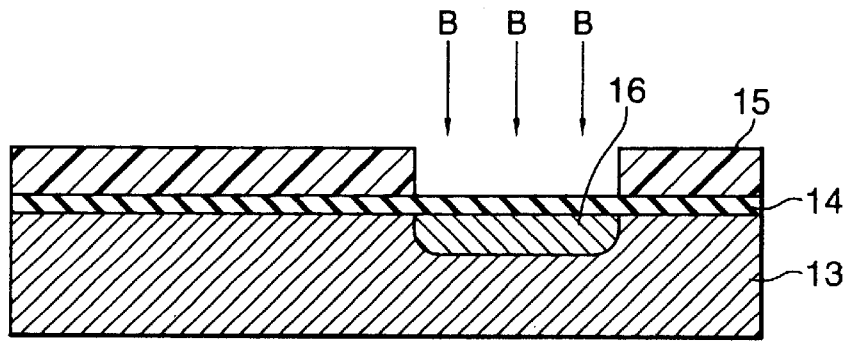
Figure 2B:
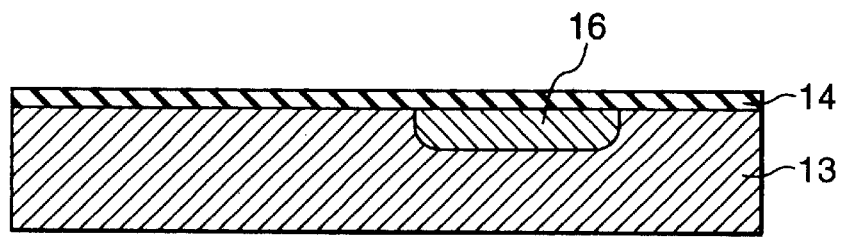

First, as shown in FIG. 2A, a silicon oxide layer 14 is formed by thermal oxidation on an n-type silicon semiconductor substrate 13 doped with phosphorus. Next, a photoresist 15 is used to form a pattern for a p-well area 16 on the silicon oxide layer 14, then ion implantation is used to drive boron into the silicon substrate. Next, as shown in FIG. 2B, the resist layer 15 is removed.

Figure 2C:
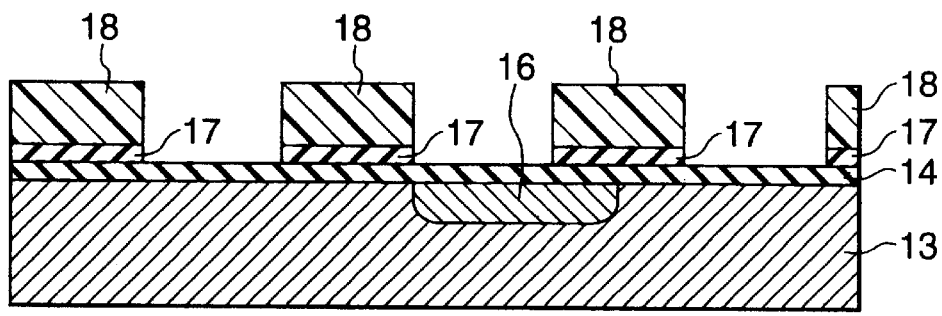

Next, as shown in FIG. 2C, a silicon nitride layer 17 is deposited over the entire surface by CVD for example, then a photoresist layer 18 is used to form element isolation regions. The parts of the silicon nitride layer 17 at the openings of the photoresist layer 18 are then removed by etching to form holes.

Figure 2D:
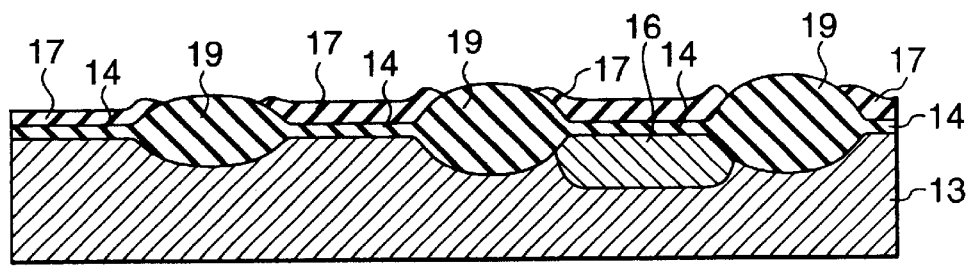

Next, as shown in FIG. 2D, a thick oxide layer 19 is selectively formed by selective oxidation, that is, the LOCOS method.

Figure 2E:
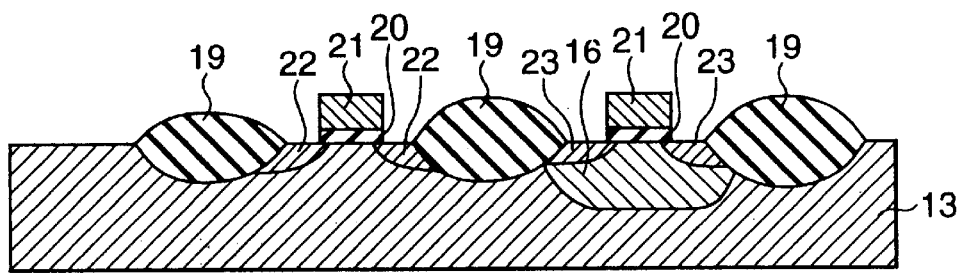

Next, as shown in FIG. 2E, the silicon nitride layer 17 which was used as a mask and the silicon oxide layer 14 under it are removed by etching. A new silicon oxide layer 20 is formed, then a polycrystalline silicon layer is grown on it by CVD. Gate electrodes 21 are then formed by a similar method as with the patterning for element isolation.

Next, using a similar method as with the formation of p-wells, ion implantation is used to dope arsenic (n+) in the p-well region 16 and boron (p+) into the silicon substrate other than the p-well region 16. Thermal diffusion is then used to form the n+ regions 23 and the p+ regions 22.

Figure 2F:
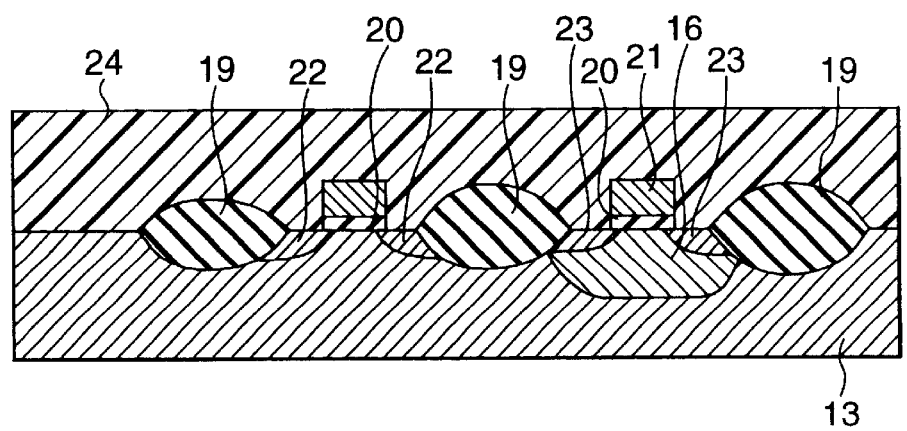

Next, as shown in FIG. 2F, after the shapes of elements such as transistors are formed, a low dielectric layer 24 having a dielectric constant of not more than 3.0 is formed on top of this to a thickness of about 500 nm. The dielectric layer 24 may be formed by for example forming precursor on the substrate by a spin-coater, then baking at 300 to 450° C. When the dielectric layer is made of amorphous carbon etc., it is possible to use acetylene and, when necessary, fluorocarbon gas, to form a layer by a plasma enhanced CVD system and then bake at 300 to 450° C.

Figure 2G:
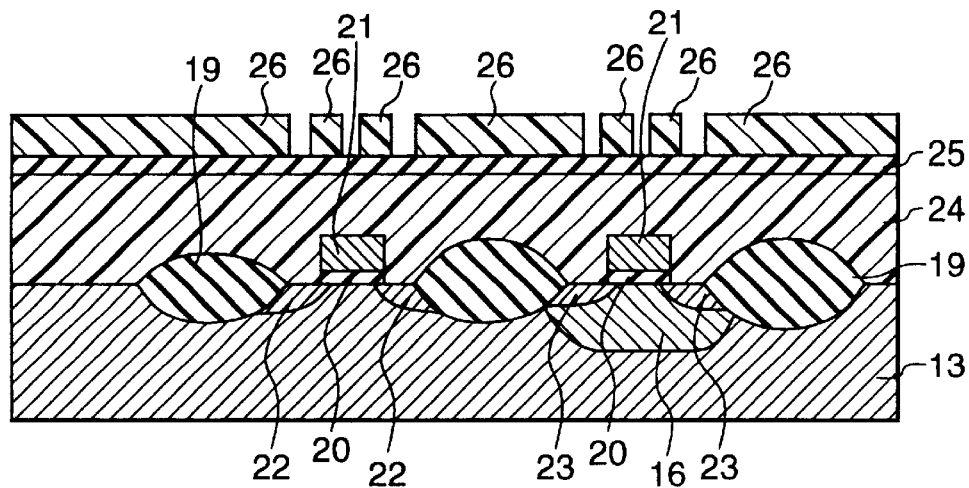

Next, as shown in FIG. 2G, a silicon oxide layer 25 is formed as an inorganic layer on the organic layer 24, then a resist layer 26 is formed and patterned for forming the contact holes for connecting the elements and the metal interconnections. The silicon oxide layer 25 can be formed for example by a plasma enhanced CVD system under reducing conditions of 50 sccm of silane gas and 1000 sccm of $N_2O$ gas, 500 W plasma power, 10 Torr pressure, and 350° C. temperature.

Figure 2H:
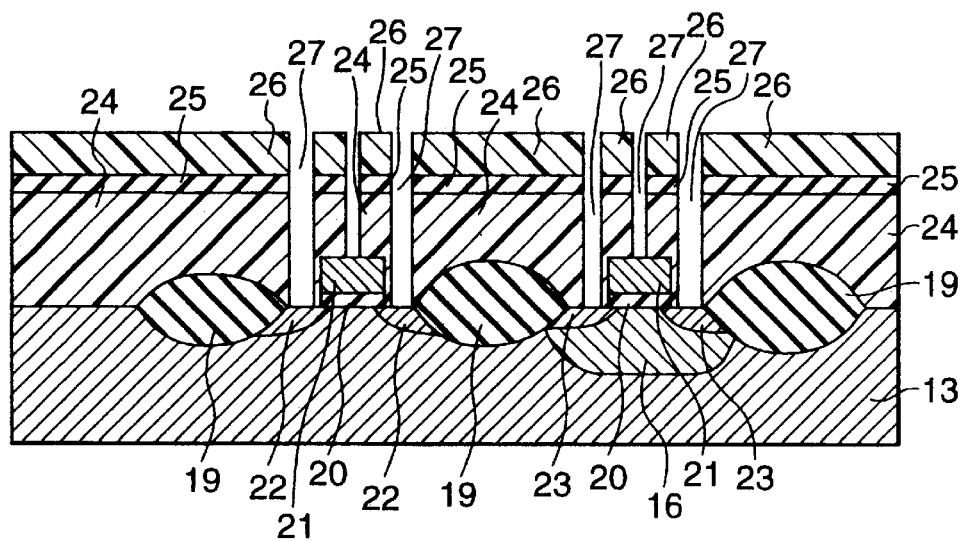

Next, as shown in FIG. 2H, contact holes 27 are opened. The contact holes 27 can be formed, for example, by using a general magnetron reactive ion etching system to etch the topmost silicon oxide layer 25 and the lower organic layer 24. The etching conditions may be for example, in the case of the low dielectric layer, an etching as of 5 sccm of $CHF_3$, 50 sccm of $O_2$, and 200 sccm of He, an RP power of 500 W, and a low temperature of −10° C., and, in the case of a silicon oxide layer, for example, an etching gas of 14 sccm of $C_2F_6$, 180 sccm of CO, 240 sccm of Ar, and 6 sccm of $O_2$ and an RF power of 1500 W. In this case, the upper silicon oxide layer 25 also serves as a mask when etching the low dielectric layer.

Figure 2I:
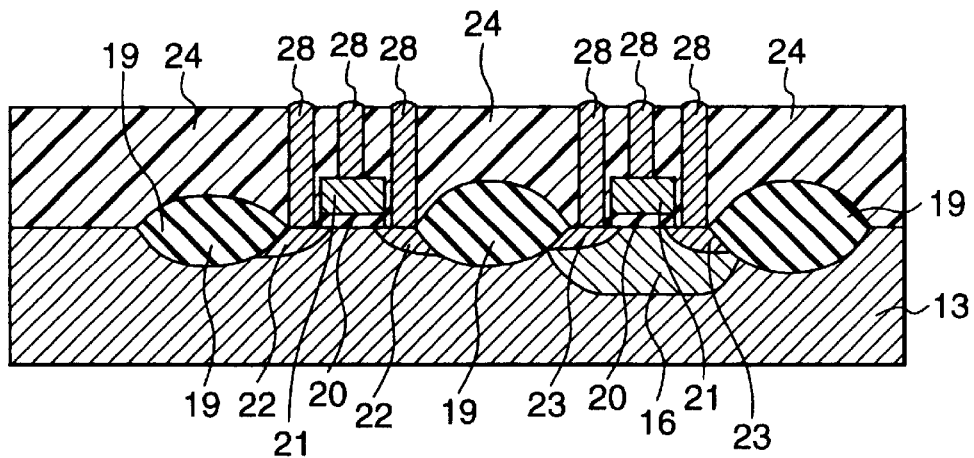

Next, as shown in FIG. 2I, interconnections 28 are formed by the damascene method. Namely, as the material of the interconnections, for example, copper is deposited over the entire surface by sputtering or a CVD system. Next, the smoothing, such as CMP is used to polish off the excess metal using for example alumina. This is to both completely polish off the excess metal and to remove scratches in the silicon oxide layer. Next, the silicon oxide layer is etched by a general magnetron reactive ion etching system. The conditions at this time are for example 14 sccm of $C_2F_6$, 180 sccm of CO, and 240 sccm of Ar. Under these conditions, the dielectric layer 24 is not etched much at all.

The upper surface of the metal interconnections 28 is formed higher than that of the dielectric layer due to the removal of the oxide layer 25.

Figure 2J:
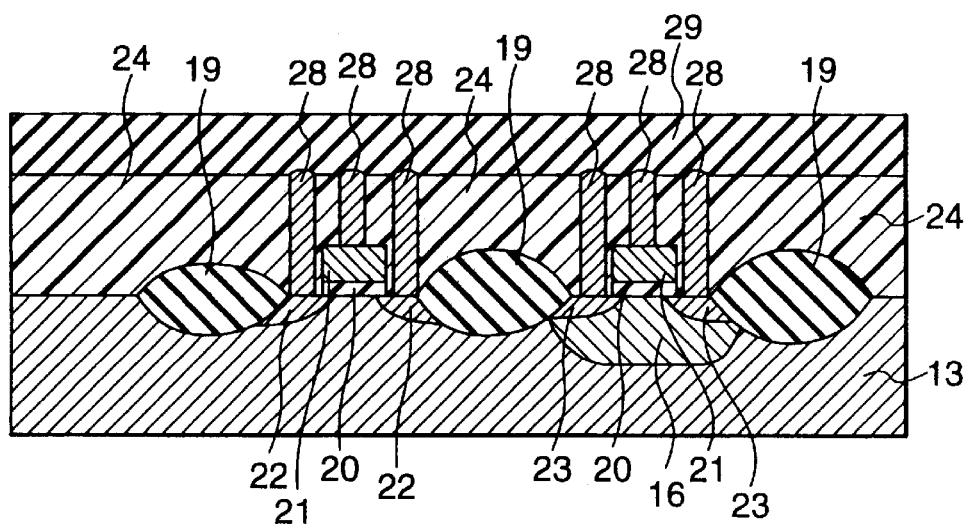

Next, as shown in FIG. 2J, the surface of the substrate is washed, then a silicon oxide layer 29 is formed to a thickness of 300 nm as a passivation layer. After the end of the wafer process, a mounting and bonding process is applied to produce the desired semiconductor device.

As explained above, according to the present embodiment, it is possible to efficiently manufacture a semiconductor device of a miniature structure using a low dielectric film and suppressing the increase in the capacitance between interconnections.

Third Embodiment

The third embodiment of the present invention shows a method of manufacturing a semiconductor device using a low dielectric layer as a passivation layer.

First, while not shown in the figures, an intermediate of a semiconductor device similar to that shown in FIG. 2I is formed. Namely, a gate electrode is formed on a gate oxide layer in an area isolated by an element isolation layer on a semiconductor substrate, a lower conductive layer is formed connecting with the source and drain regions 22' and 23' via contact plugs, a silicon oxide layer is formed over the entire surface, and via contact plugs for connecting with an upper interconnection layer are formed by using a resist layer as a mask.

Figure 3A:
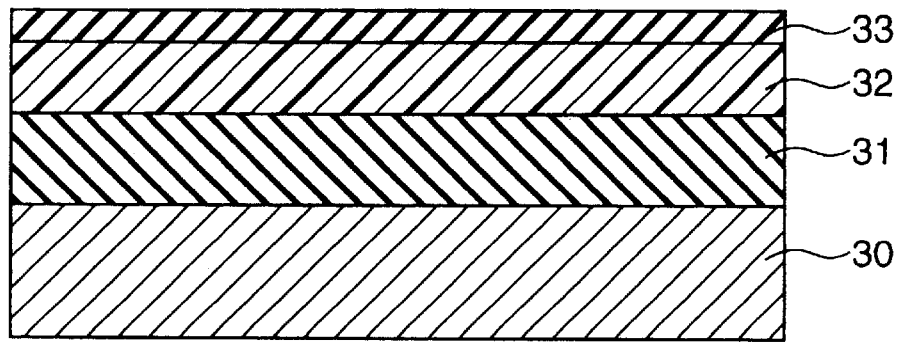

Next, as shown in FIG. 3A, a silicon oxide layer 31 is formed to a thickness of 500 nm on the silicon substrate 30 comprising the above intermediate, a detailed illustration of which is omitted for simplification, then a low dielectric layer 32 having a dielectric constant of not more than 3.0 is formed to a thickness of 500 nm and a silicon oxide layer 33 is formed as an inorganic layer to a thickness of 100 nm.

The low dielectric layer 32 can be formed in the same way as described in the second embodiment. The silicon oxide layer 33 can be formed in a reducing atmosphere by the plasma enhanced CVD system in the same way as the second embodiment. For example, it can be formed under conditions of 50 sccm of silane gas and 1000 sccm of $N_2O$ gas, a power of 500 W, a pressure of 10 Torr, and a temperature 350° C.

Figure 3B:
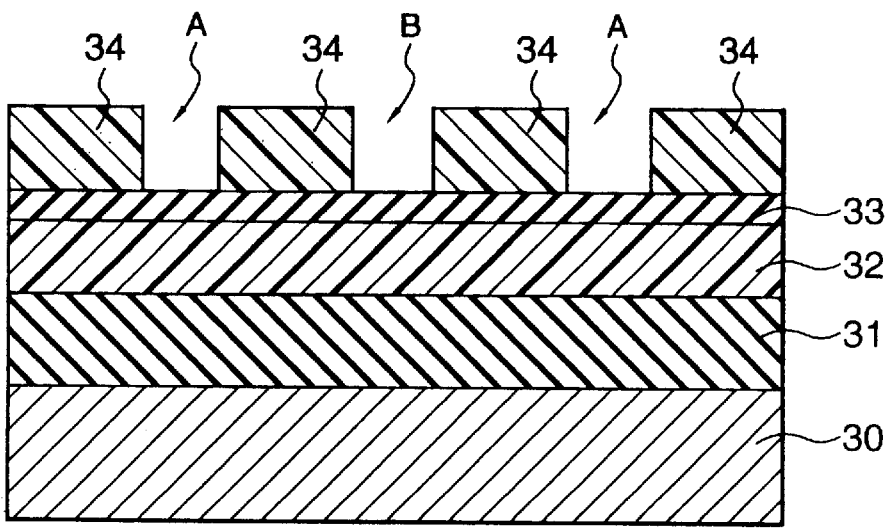
Figure 3C:
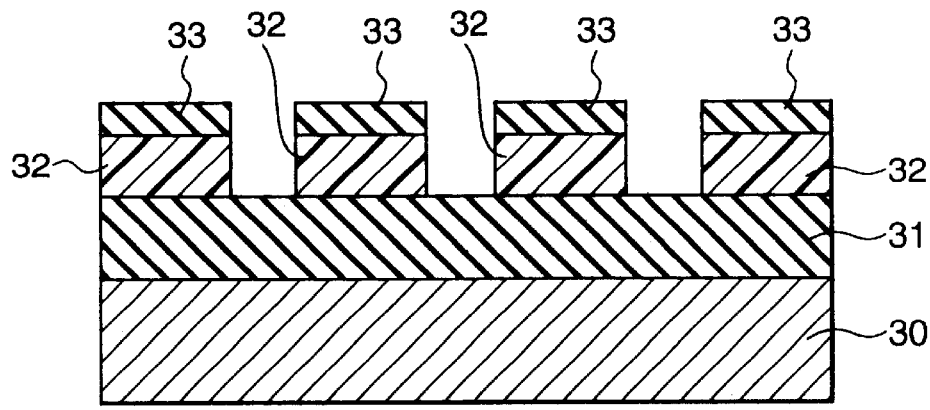

Next, as shown in FIG. 3B, the interconnection pattern is formed using a resist 34 as a mask. Next, as shown in FIG. 3C, a general magnetron reactive ion etching system is used to etch the topmost silicon oxide layer 33 and the underlying organic layer 32. For example, in the case of the low dielectric layer, the etching can be performed by using a gas of 5 sccm of $CHF_3$, 50 sccm Of $O_2$, and 200 sccm of He, an RF power of 500 W, and a low temperature of −10° C. Further, in the case of the silicon oxide film, the etching can be performed by using an etching gas of 14 sccm of $C_2F_6$, 180 sccm of CO, 240 sccm of Ar, and 6 sccm of $O_2$ and an RF power of 1500 W. In this case, the silicon oxide layer 33 also serves as a mask when etching the low dielectric layer 32.

Figure 3D:
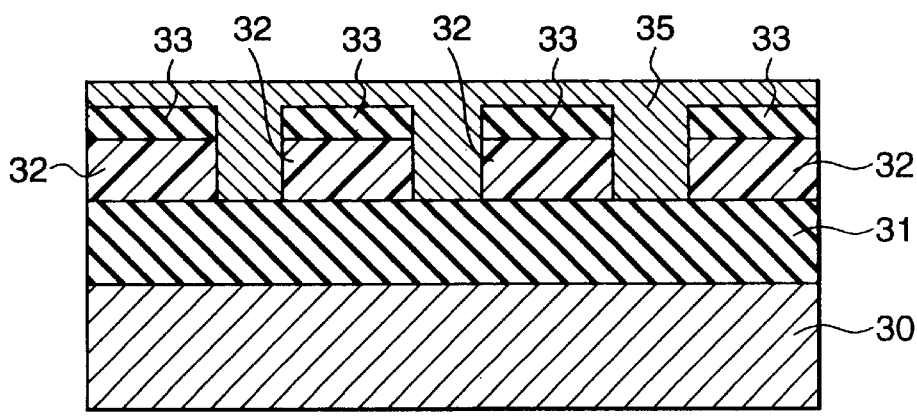

Next, shown in FIG. 3D, as the material of the interconnections, for example, copper is deposited by sputtering or a CVD system. Next, the excess metal is polished off by CMP using alumina. This is to both completely polish off the excess metal and to remove scratches in the silicon oxide layer.

Next, the silicon oxide layer 33 is etched by a general magnetron reactive ion etching system. The conditions at this time are for example 14 sccm of $C_2F_6$, 180 sccm of CO, and 240 sccm of Ar. Under these conditions, the low dielectric layer 32 is not etched much at all.

Figure 3E:
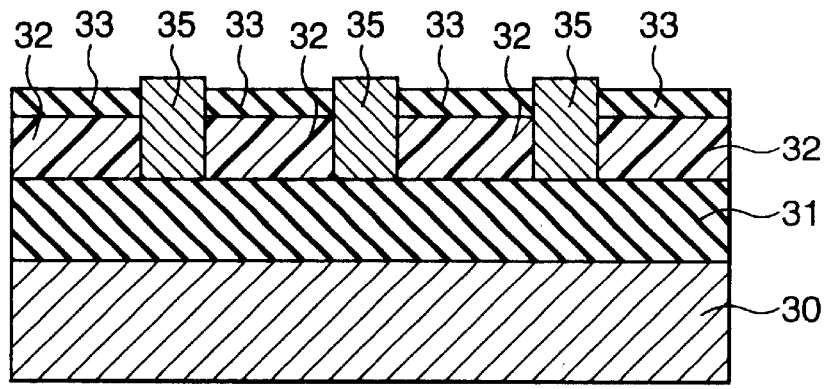

In this way, as shown in FIG. 3E, the upper surface of the metal interconnections 35 is formed higher than that of the organic layer 32.

Figure 3F:
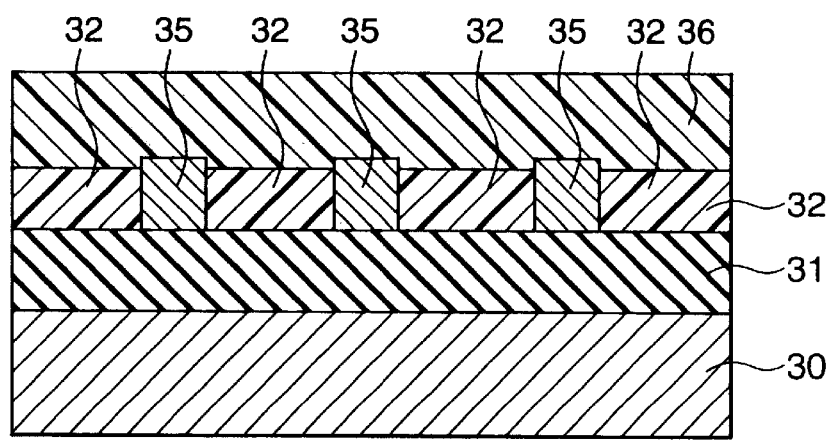

Next, as shown in FIG. 3F, the surface of the substrate is washed, then a second low dielectric layer 36 is formed to a thickness of 300 nm in the same way as the first low dielectric layer as a passivation layer.

Finally, after the end of the wafer process, a mounting and bonding process is applied to produce the desired semiconductor device.

As explained above, according to the present embodiment, it is possible to efficiently manufacture a semiconductor device of a miniature structure using a low dielectric film. Further, since the semiconductor device manufactured according to this embodiment uses a second low dielectric layer in the same way as the first low dielectric layer as a passivation layer, it is possible to obtain a semiconductor device with a small capacitance between interconnections.

Fourth Embodiment

The fourth embodiment shows an example of the manufacture of a semiconductor device having a two-layer interconnection structure and having dummy interconnections 42.

Figure 4A:
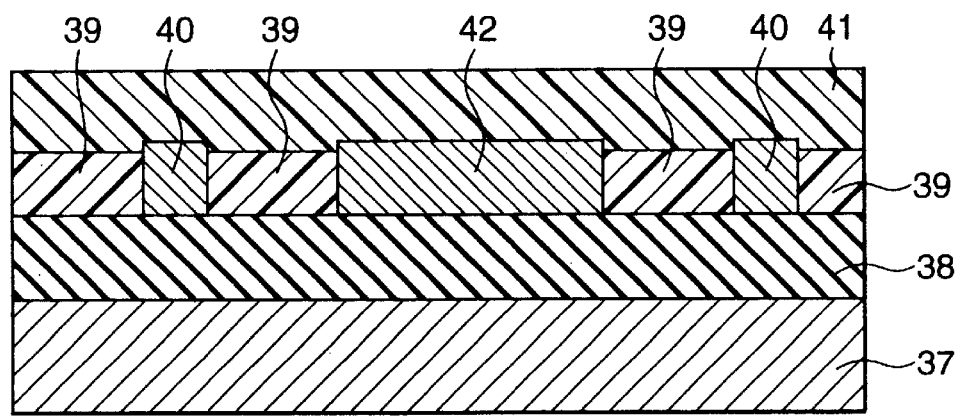

FIG. 4A is a sectional view of the structure obtained by the same process as up to FIG. 3F except for provision of dummy interconnections as paths for heat dispersion.

Namely, first, a silicon oxide layer 38 is formed to a thickness of 500 nm on a silicon semiconductor substrate 37 having not shown transistors and an interconnection patterns. A low dielectric layer 39 having a dielectric constant of not more than 3.0 is then formed on this to a thickness of 500 nm, then interconnections 40 comprised of copper and a second low dielectric layer 41 are formed in turn.

The dummy interconnections 42 are formed, after forming the metal interconnections by CMP, by etching a dummy pattern using a resist as a mask. At this time, dummy patterns are inserted at areas of interconnection spaces of not less than 3 times the minimum pitch so as to eliminate locations with interconnection spaces of more than 1 μm. The insertion of a dummy interconnection depends on the aspect ratio of the interconnections and the minimum pitch of interconnections (absolute value). For example, in the case of an aspect ratio 2 and a minimum pitch of interconnections of 0.5 μm, since the smallest interconnection space is about 0.25 μm, it is preferable to secure at least an interconnection space of 0.75 μm and to form dummy interconnections to eliminate interconnection spaces of over 1 μm. Next, the second low dielectric layer 41 is formed in the same way as the formation of the first dielectric layer to obtain the state shown in FIG. 4A.

Figure 4B:
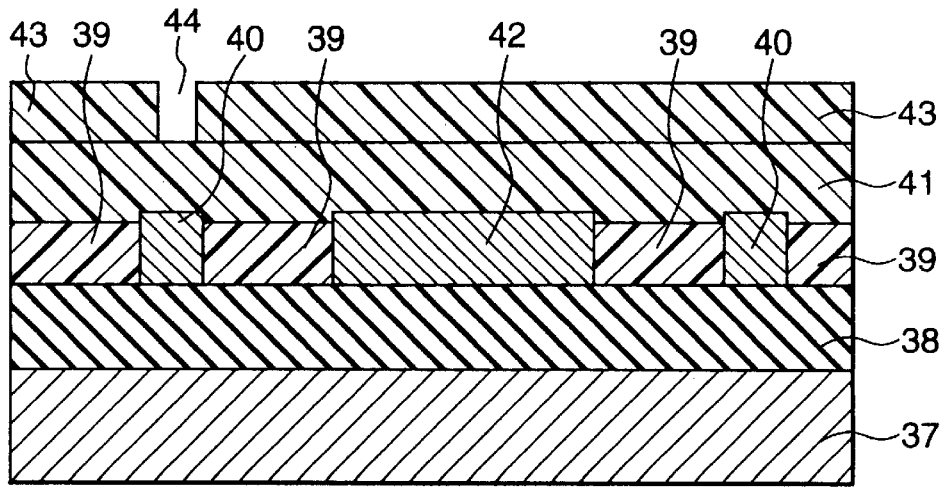
Figure 4C:
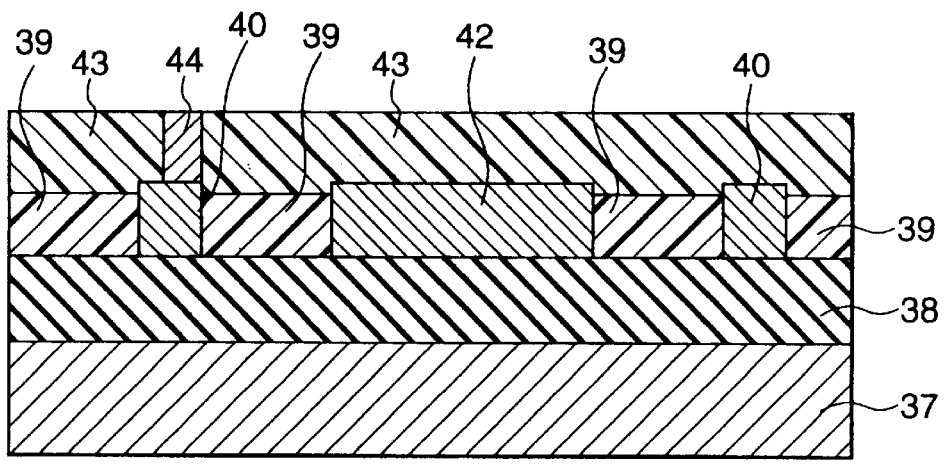

Next, as shown in FIG. 4B, a resist layer 43 is deposited on the entire surface, then patterning is performed for forming the contact hole 44 connecting the first layer interconnection and the second layer interconnection. Next, as shown in FIG. 4C, a metal such as tungsten is used to bury the contact hole 44.

Figure 4D:
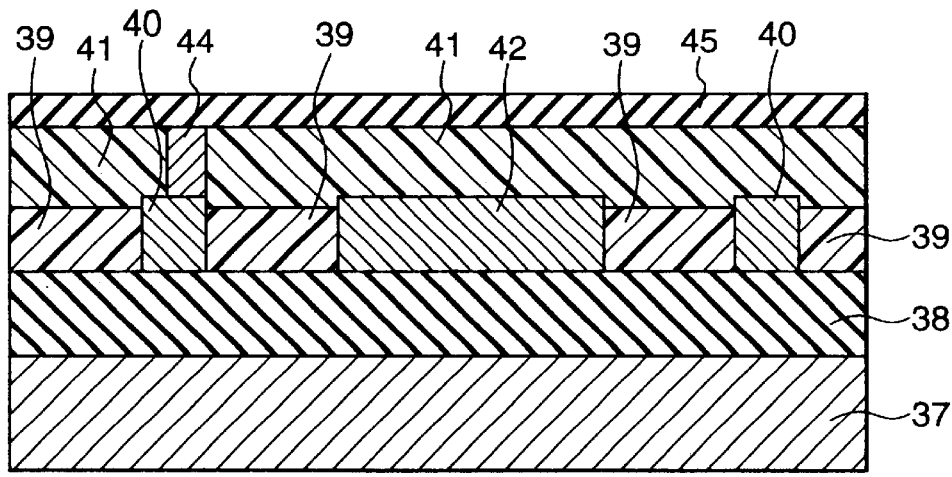
Figure 4E:
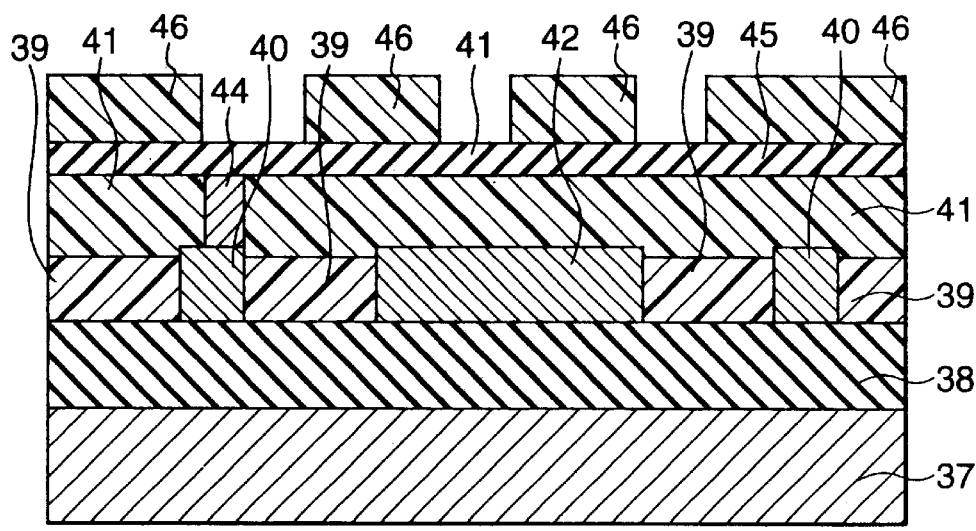
Figure 4F:
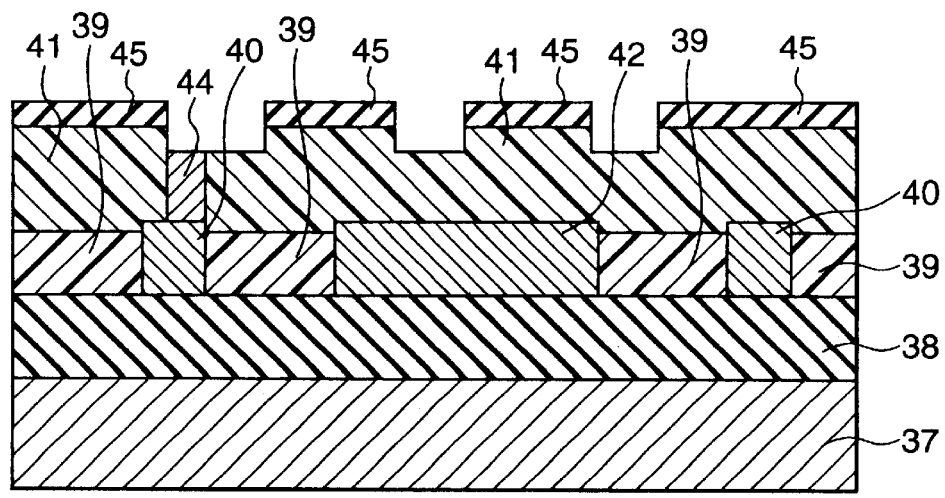

Next, as shown in FIG. 4D, an inorganic layer 45 comprised of silicon nitride is formed over the entire surface to a thickness of 100 nm by for example CVD, then, as shown in FIG. 4E, the patterning for the second interconnections is performed using a resist 46. Next, as shown in FIG. 4F, the interconnection pattern is formed by photoetching.

Figure 4G:
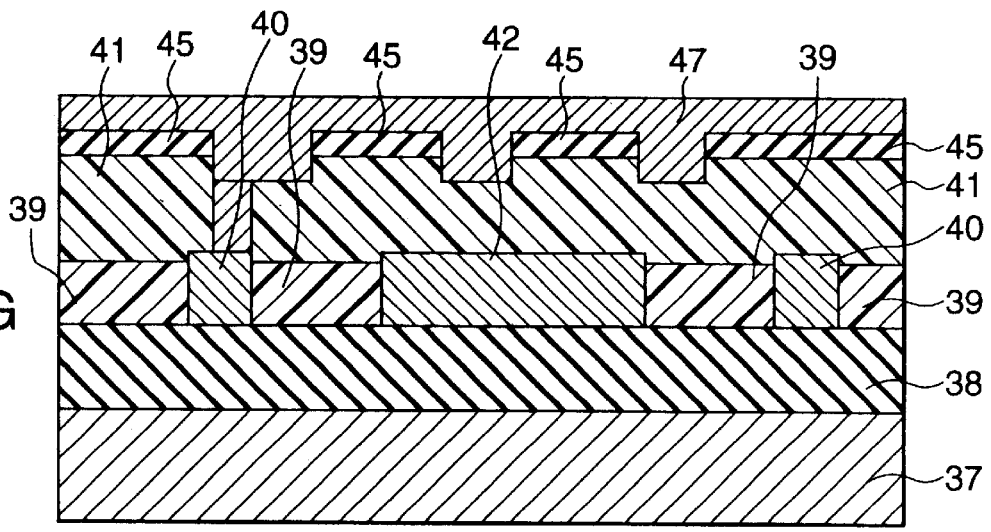
Figure 4H:
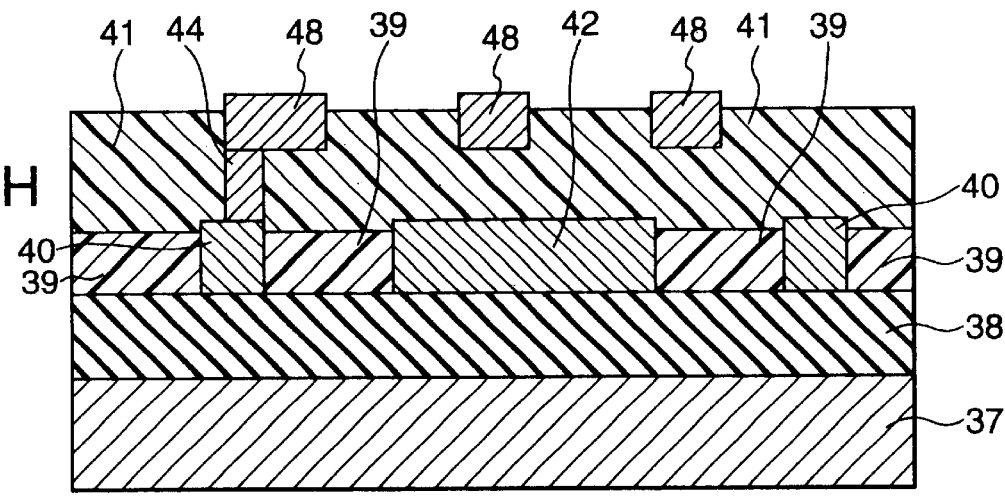

Next, as shown in FIG. 4G, aluminum 47 is deposited as an interconnection material by vacuum evaporation. Next, as shown in FIG. 4H, second interconnections 48 are formed by CMP in the same way as explained above.

The upper surface of the second metal interconnections 48 formed in this way is higher than the upper surface of the second organic layer 40.

Figure 4I:
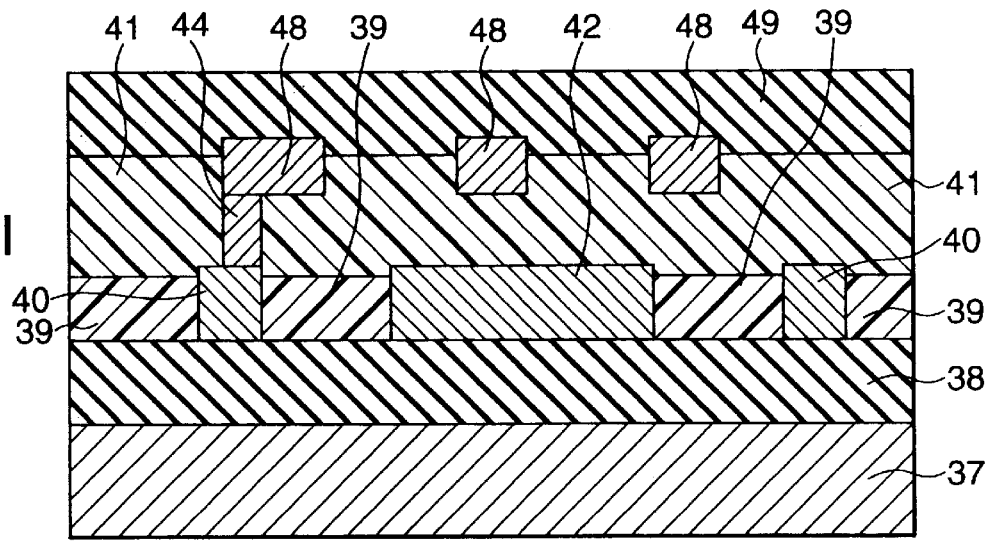

Next, as shown in FIG. 4I, the surface of the substrate is washed, then a silicon oxide layer 49 is formed by CVD to a thickness of 500 nm as a passivation layer.

Finally, after the end of the wafer process, a mounting and bonding process is applied to produce the desired semiconductor device.

As explained above, according to the present embodiment, it is possible to efficiently manufacture a extremely reliable semiconductor device of a miniature structure using a low dielectric film.

Further, since the semiconductor device manufactured according to this embodiment uses a low dielectric layer as an inter-layer insulating layer, it is possible to greatly reduce the capacitance between interconnections.

Further, since dummy interconnections are inserted at locations of interconnection spaces at least three times the minimum pitch so as to eliminate locations of interconnection spaces of more than 1 μm, even if use is made of an organic layer with its low heat conductivity, it is possible to disperse the heat generated in the semiconductor device to the outside, so a highly reliable semiconductor device free from trouble caused by the generation of heat is obtained.

Fifth Embodiment

The fifth embodiment of the present invention shows an example of a semiconductor device having a two-layer structure which uses a layer containing xerogel as an inter-layer insulating layer between interconnection layers (horizontal) and uses a dielectric layer having a dielectric constant of not more than 3.0 between the interconnection layers (vertical). FIGS. 5A to 5F are cross-section views of the main steps in the method of manufacturing the semiconductor device of the present embodiment. Note that in the figures, illustrations of elements such as the element isolation layer and electrodes are omitted for convenience.

First, an insulating layer 51 comprised of silicon oxide, silicon oxynitride, silicon nitride, etc. is formed on a silicon substrate 50 having not shown transistors and interconnections. A silicon oxide layer can be formed, for example, by using spin coating to coat commercially available inorganic SOG (containing silanol or a polymer containing silanol as its main ingredients) to a thickness of about 50 nm. After spin coating, it is baked for 1 minute at 150 to 200° C. and then cured for 30 minutes to one hour at 350 to 450° C. A silicon oxide layer can also be formed by plasma enhanced CVD using a plasma system. In this case, to prevent oxidation of the copper interconnections as much as possible, $N_2O$ gas is preferably used as a oxidant and a silane compound such as monosilane, disilane, or trisilane is used as a source of silicon. In the case of using plasma enhanced CVD, it is possible to form the layer under conditions of a substrate temperature of 300 to 400° C., a power of 350 W, and a pressure of about 1 kPa.

In the case of a silicon oxynitride layer, it is possible to form the layer by spin coating using a commercially available inorganic SOG having amino groups. Preferably, it can be formed by using plasma enhanced CVD. As the gases used, for example, a silane such as monosilane, disilane, and trisilane may be used as the silicon source, for example, ammonia and hydrazine may be used as the nitrizing agent, $N_2O$ gas may be used as the oxidant, and nitrogen, helium, argon, etc. may be used as the carrier gas. The layer can be formed at a substrate temperature of 300 to 400° C., a power of 350 W, and a pressure of about 1 kPa.

In the case of a silicon nitride layer, the layer can be formed in the same way by spin coating using a commercially available inorganic SOG having amino groups, but preferably it is formed using plasma enhanced CVD. As the gases used, a silane such as monosilane, disilane, and trisilane may be used for the silicon source, ammonia, hydrazine, etc. may be used for the nitrizing agent, and nitrogen, helium, argon, etc. may be used for the carrier gas. The layer can be formed at a substrate temperature of 300 to 400° C., a power of 350 W, and a pressure of about 1 kPa.

Next, a not shown resist layer is formed over the entire surface, then predetermined patterning is performed. Contact holes are formed by photoetching and then buried by a metal such as tungsten to form the contact plugs 52.

Figure 5A:
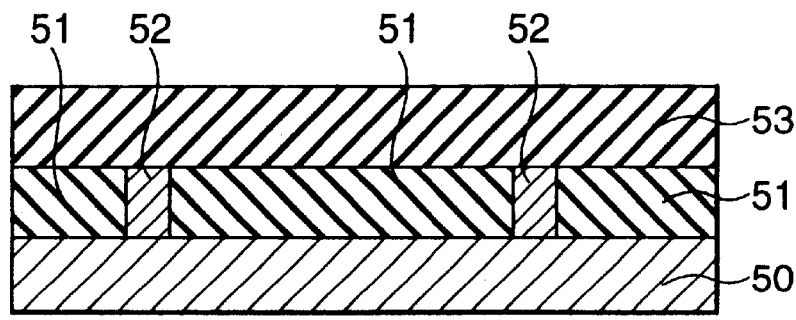

Next, a low dielectric layer 53 is formed to a thickness of about 300 to 800 nm to obtain the state shown in FIG. 5A. The low dielectric layer 53 is not particularly limited so long as it is an insulating layer having a dielectric constant of not more than 3.0. For example, a low dielectric layer or a layer containing xerogel may be exemplified. As other low dielectric layers, the ones listed above may be used as well.

Next, an inorganic layer 56 comprised of silicon nitride, a silane coupling agent, etc. is formed over the entire surface by for example CVD to a thickness of 100 nm, patterning is performed for the first interconnections by a not shown resist layer, then the interconnection pattern is formed by photoetching. The etching at this time can be performed for example by a commercially available etching system using 14 sccm of $C_2F_6$, 180 sccm of CO, and 240 sccm of Ar gas at an RF power of 1500 W.

Figure 5B:
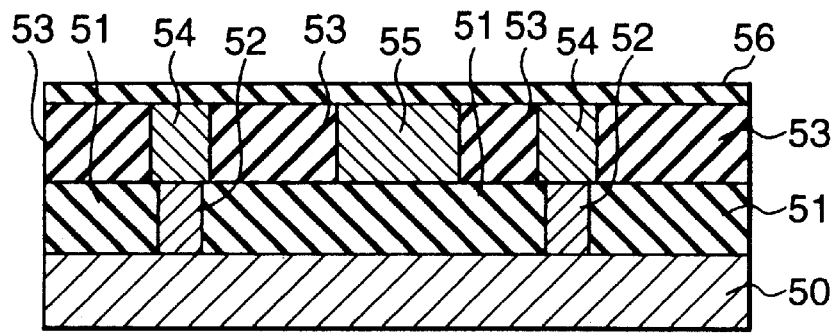

Next, as shown in FIG. 5B, a metal such as aluminum, copper, copper alloy, or tungsten is deposited as an interconnection material on the entire surface by vacuum evaporation and first interconnections 54 are formed by CMP. At this time, it is preferable that the inorganic layer 56 be removed completely, but in actual manufacture it may be left on the substrate as shown in FIG. 5B.

Figure 5C:
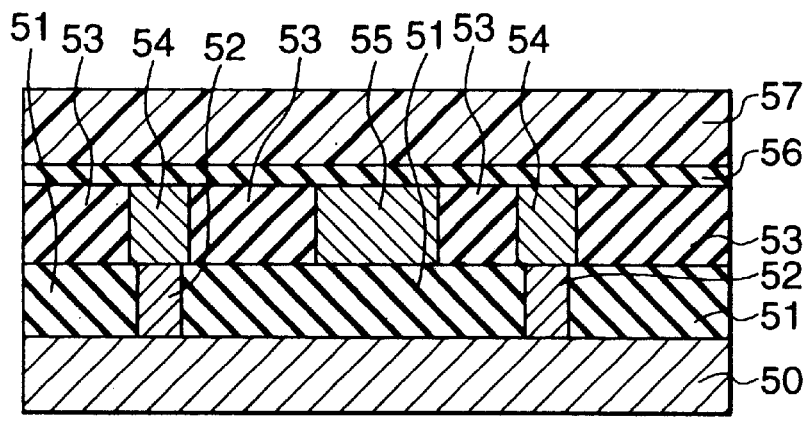

Next, as shown in FIG. 5C, a low dielectric layer 57 is formed over the entire surface to a thickness of 800 nm or so. The layer can for example be formed by forming a precursor by spin coating, then curing (baking) at 300 to 450° C. As the material for the low dielectric layer, one having a dielectric constant of not more than 3.0 is preferable, for example, ones listed above may be used.

Note that when using a material such as amorphous carbon, the layer may be formed by using acetylene or, if necessary, a fluorocarbon gas and using a plasma enhanced CVD system. In this case as well, curing is performed at 300 to 450° C.

Figure 5D:
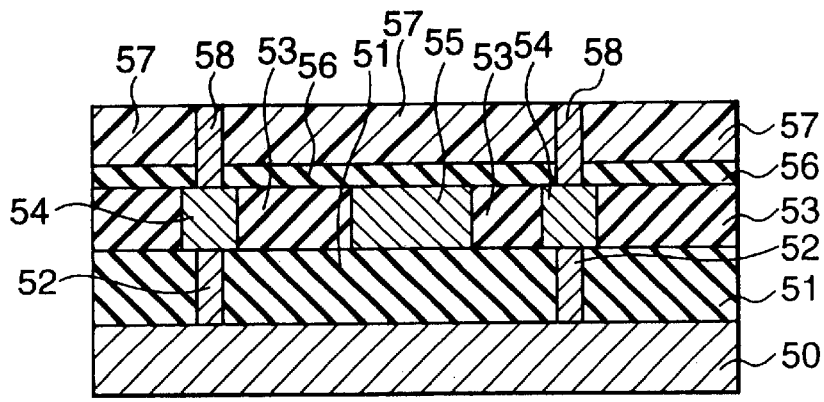

Next, a not shown resist layer is formed over the entire surface, then predetermined patterning is performed and photoetching is used to form second contact holes up to the first interconnections, then the holes are buried by a metal such as tungsten to form via contact plugs 58 (FIG. 5D).

Figure 5E:
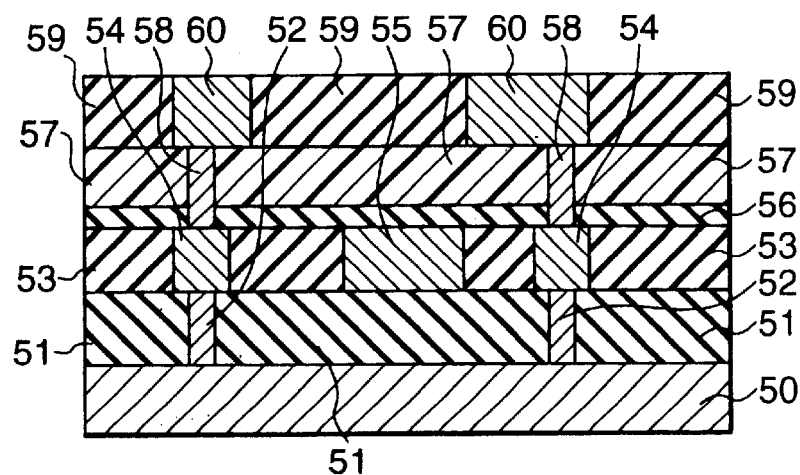

Next, as shown in FIG. 5E, a layer containing xerogel 59 is formed over the entire surface, for example, to a thickness of about 500 nm. As the xerogel, for example, use may be made of Nanoporous Silica (brandname) developed by Nanoglass Co. Nanoporous Silica is a kind of porous silica. This embodiment, however, is not limited to this. The gel may be any which is formed by coating the wafer with a silanol resin having an aromatic group or other relatively high molecular weight alkyl group, making it gel, then hydrophobicizing it with a silane coupling agent or hydrogenation.

Note that in this case, since layer containing xerogel is particularly poor in inter-layer adhesion, it is preferable to coat a silane coupling agent as listed above on the low dielectric layer for preventing peeling. As the silane coupling agent, alkyl silanes of the general formulas $RSiX_3$ or $RR'SiX_2$ (wherein R and R' each represents an alkyl group, X represents a halogen atom) may be used.

Next, a not shown resist layer is formed over the entire surface, the predetermined patterning is performed and photoetching is used to form trenches for the interconnections. The etching at this time may be performed by for example a commercially available etching system using 14 sccm of $C_2F_6$, 180 sccm of CO, and 240 sccm of Ar gas and an RF power of 1500 W. Next, as shown in FIG. 5E, a metal such as aluminum, copper, copper alloy, and tungsten is deposited over the entire surface as an interconnection material by vacuum evaporation etc., then a not shown inorganic layer is deposited and for example a silica based slurry is used to form the second interconnections 60 by CMP. At this time, as the inorganic layer, it is possible to use one the same as that listed when forming the first interconnections. Note that the inorganic layer is preferably removed completely, but in actual manufacture, it may be left on the substrate.

Figure 5F:
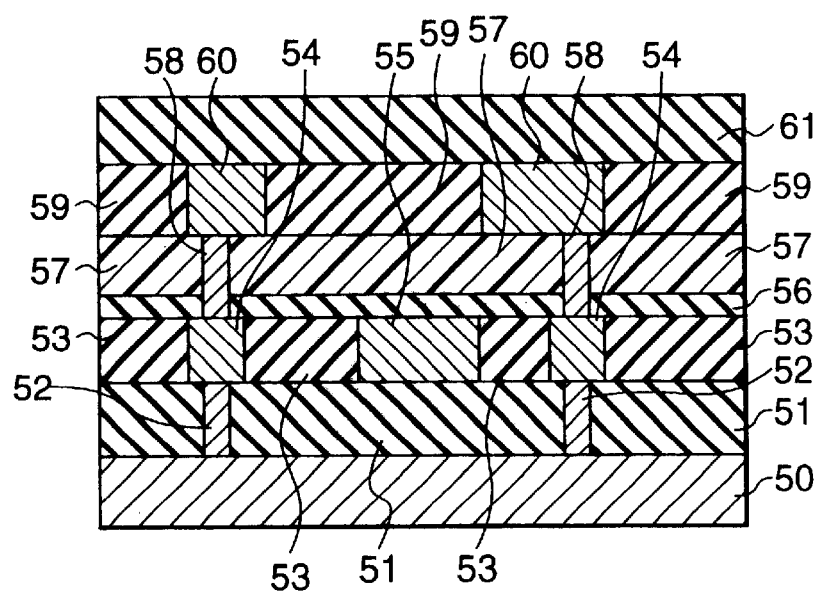

Finally, as shown in FIG. 5F, an insulating layer 61 comprised of silicon oxide etc. is formed over the entire surface as a passivation layer, whereby the process for forming of the interconnections is ended.

In the present embodiment, a layer containing xerogel which has a extremely low dielectric constant is used at surroundings of interconnections (left and right of interconnections), preferably at locations of interconnection spaces not more than three times the standard pitch, and dielectric layers having a dielectric constant of not more than 3.0 are used at surroundings of contact holes between interconnections (above and below interconnections). Therefore, it is possible to make up for the defects of a xerogel layer, that is, the poor mechanical strength, thermal conductivity, heat resistance, moisture resistance, and inter-layer adhesion and greatly reduce the capacitance between interconnections and therefore manufacture a highly reliable semiconductor device having a miniature structure in a good yield.

Further, by providing layers comprised of a silane coupling agent above and below the layer containing xerogel, it is possible to manufacture a semiconductor device which has an excellent inter-layer adhesion.

Further, since dummy interconnections are provided for dispersing heat, there is little heat generated by the semiconductor device as a whole and it is possible to manufacture a highly reliable semiconductor device which is relatively free of misoperation due to rising temperature.

Sixth Embodiment

The sixth embodiment shows an example of use of a low dielectric layer as an inter-layer insulating layer and formation of dummy interconnections and dummy contact holes for dispersing heat.

Figure 6A:
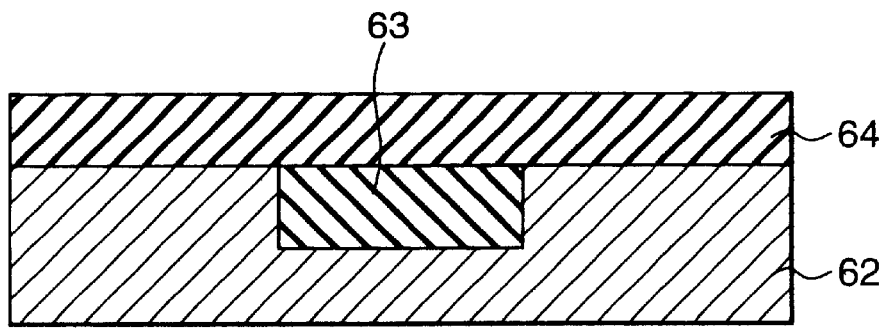

First, as shown in FIG. 6A, a lower inter-layer insulating layer 64 is formed on a silicon semiconductor substrate 62 having not shown transistors and other active elements and element isolation layer 63.

Figure 6B:
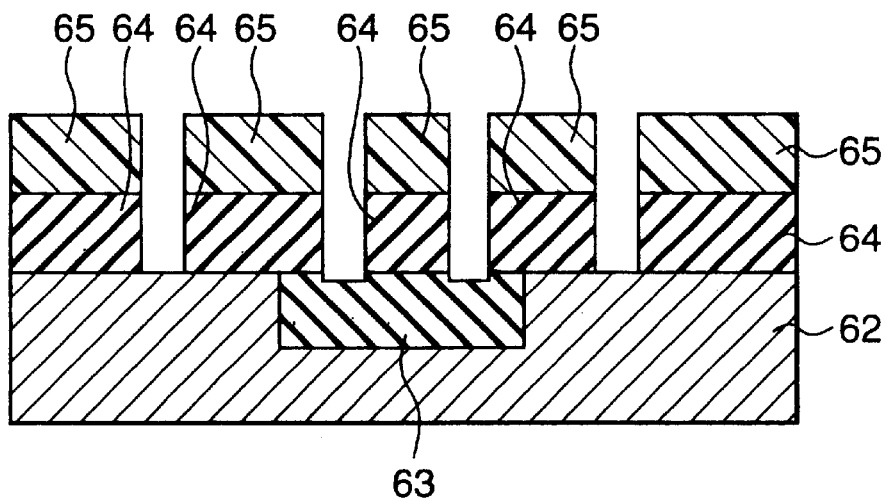

Next, as shown in FIG. 6B, a resist layer 65 is formed over the entire surface and patterning is performed for forming contact plugs (contact holes) 66 and dummy contact plugs 67. The dummy contact holes are preferably formed under the dummy interconnections formed above on the inter-layer insulating layer 63 for manufacturing purposes. Further, the contact pitch is preferably the minimum pitch. By making the pitch the minimum pitch, the heat conductivity is improved and heat dispersion efficiency is raised.

Figure 6C:
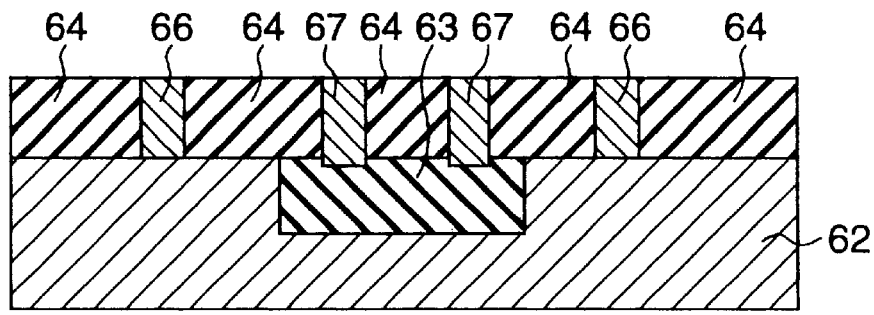

The transistors, element isolation layers, lower inter-layer insulating layer, contact plugs, and other elements may be formed using known methods. As the lower inter-layer insulating layer, for example, it is possible to form a silicon oxide layer or a silicon oxide doped with phosphorus or phosphorus and boron as impurities. Further, the contact plugs (66 and 67) may be formed by burying the holes with a conductive substance such as tungsten. This gives the state shown in FIG. 6C.

Figure 6D:
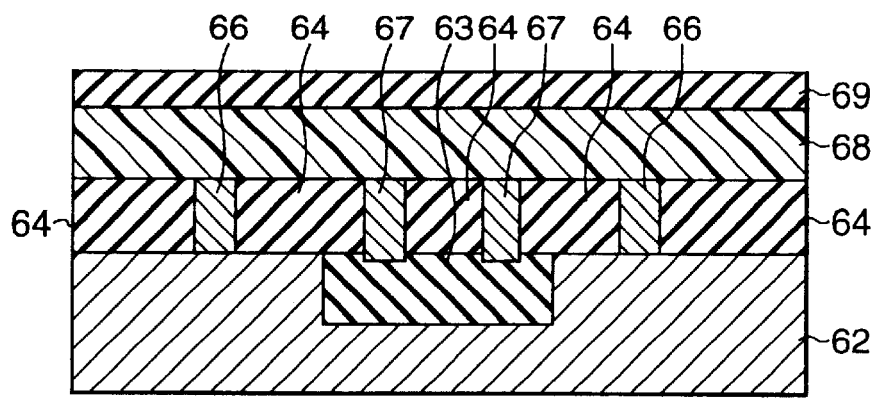

Next, as shown in FIG. 6D, a low dielectric layer 68 is formed over the entire surface, then a silicon oxide, silicon nitride, silicon oxynitride, or nitride based inorganic layer 69 is formed on the low dielectric layer 68 to a thickness of for example 100 nm.

Note that the layer is usually formed by plasma enhanced CVD, but it is preferable to do this under a reducing atmosphere. When using CVD in an oxidizing atmosphere, the low dielectric organic layer may be oxidized and peeling or other undesirable phenomenon may occur.

As the etching conditions, when forming a silicon oxide layer, use may be made for example of a plasma enhanced CVD system, 50 sccm of silane and 100 sccm of N2O gas, an RF power of 500 W, a pressure of 10 Torr, and a temperature of 350° C.

Figure 6E:
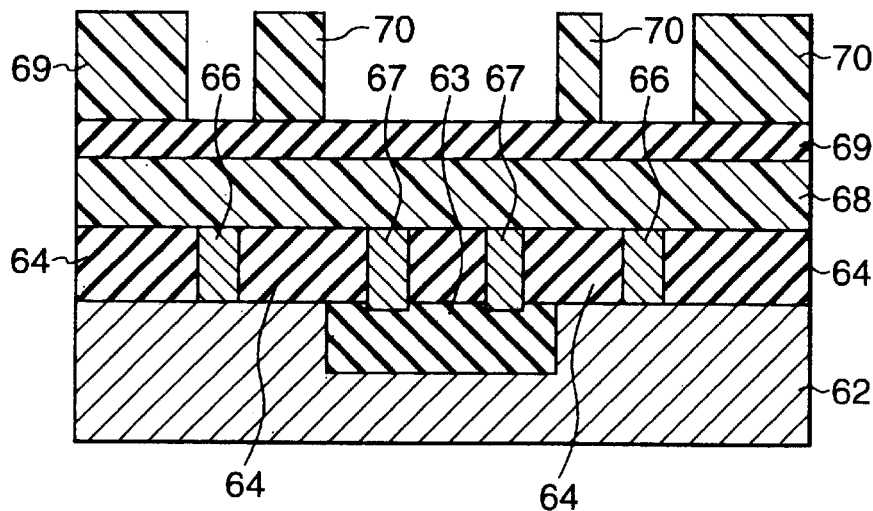

Next, as shown in FIG. 6E, a resist layer 70 is formed over the entire surface and patterning is performed for forming interconnections and dummy interconnections. The patterning for the dummy interconnections is preferably performed at portions of interconnection spaces of at least three times the pitch, more preferably at portions of interconnection spaces of at least three times the pitch so that all of the interconnection spaces become less than 1 µm.

Note that in this case, the patterning for the interconnections and the patterning for the dummy interconnections do not necessarily have to be performed simultaneously.

Next, the general magnetron reactive ion etching system is used to etch the topmost silicon oxide layer 69 and the lower low dielectric layer 68. The etching may be performed, in the case of etching a silicon oxide layer, using for example 14 sccm of $C_2F_6$, 180 sccm of CO, 240 sccm of argon, and 6 sccm of $O_2$ gas and an RF power of 1500 W. Further, in the case of etching a low dielectric layer, it may be performed using 5 sccm of $CHF_3$, 50 sccm Of $O_2$, and 200 sccm of He gas, an RF power of 500 W, and a temperature of −10° C.

In the above etching, the upper silicon oxide layer 69 also serves as a mask when etching the low dielectric layer 68. Namely, the resist layer 70 is also simultaneously etched under the conditions for etching the low dielectric layer. Note that while a silicon oxide layer was used in this embodiment, metallic materials such as TiN, TiON, TaN, TaO, TaON, WN, W, and Ti can be used as well.

Figure 6F:
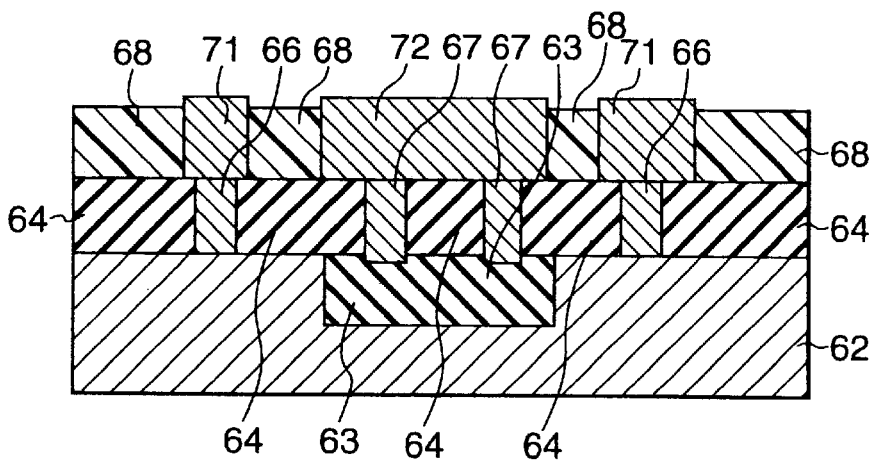

Next, as shown in FIG. 6F, the interconnections 71 and dummy interconnections 72 are formed by the damascene method. The upper surfaces of the interconnections 71 and the dummy interconnections 72 formed in the above way are formed higher than the upper surface of the low dielectric layer 68.

That is, the interconnections are formed by depositing for example copper as an interconnection material (metal) over the entire surface using a sputtering system or CVD system, then smoothing off the excess metal by CMP, then smoothing off about 50 nm of the inorganic layer (silicon oxide layer) 69 by CMP again. This is to both completely polish off the excess metal and to remove scratches in the silicon oxide layer.

Next, the silicon oxide layer 69 is etched by a general magnetron reactive ion etching system. The conditions at this time are for example 14 sccm of $C_2F_6$, 180 sccm of CO, and 240 sccm of Ar. Under these conditions, the dielectric layer is not etched much at all. Note that when stressing the reliability more than the performance of the device, the step of removing the silicon oxide layer may be omitted.

The interconnection structure obtained in this way has dummy contact plugs connecting to the dummy interconnections in addition to the dummy interconnections, so the heat dispersion effect is further enhanced. Accordingly, it is possible to obtain a semiconductor device having an extremely highly reliable interconnection structure.

Seventh Embodiment

The seventh embodiment shows an example of the manufacture of a semiconductor device having a two-layer interconnection structure and having dummy interconnections and dummy contact holes (dummy via contact holes and dummy via contact plugs).

First, the same procedure is followed as in the sixth embodiment to obtain the state shown in FIG. 6F. Next, a thin 100 nm or less silicon nitride, silicon oxide, silicon oxynitride, or other not shown inorganic layer is formed on the interconnections 71 and the dummy interconnections 72. This layer is used as an etching stopper when forming the via contact holes, so preferably is as thin as possible. In this embodiment, for example, a silicon nitride film is formed to a thickness of 10 nm.

Figure 7A:
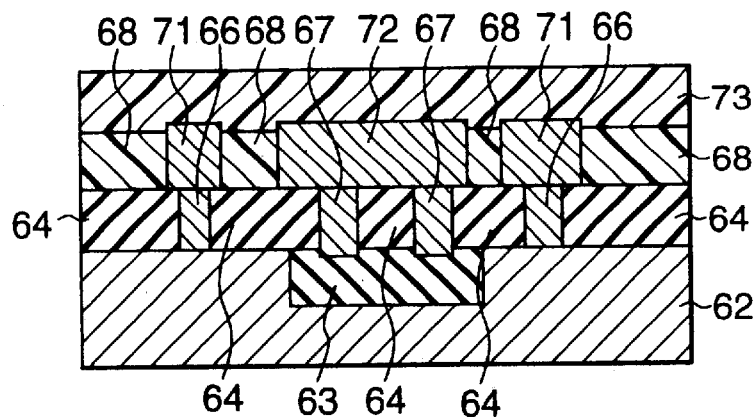

Next, as shown in FIG. 7A, a second dielectric layer 73 is formed over the entire surface. In this embodiment, as the low dielectric layer 73, in addition to those lisited above, a relatively high dielectric rate organic SOG layer, fluorine doped silicon oxide layer, fluorine doped silicon oxide, etc. may also be used. The second low dielectric layer 73 can be formed by a known method using a generally commercially available CVD system or SOG coater.

Next, an inorganic layer 74 such as silicon oxide, silicon oxynitride, and silicon nitride is formed on the second low dielectric layer 73. This layer can be generally formed by using a CVD system, but also can be formed by using an SOG coater, vacuum evaporation, or sputtering system. This inorganic layer 74 acts as an etching stopper when etching the interconnections after patterning.

Next, a resist layer 75 is formed over the entire surface, then patterning is performed for forming the via contacts and dummy via contacts. At this time, the dummy via contact holes are preferably formed at the minimum pitch at locations where dummy interconnections are formed above or below.

Figure 7B:
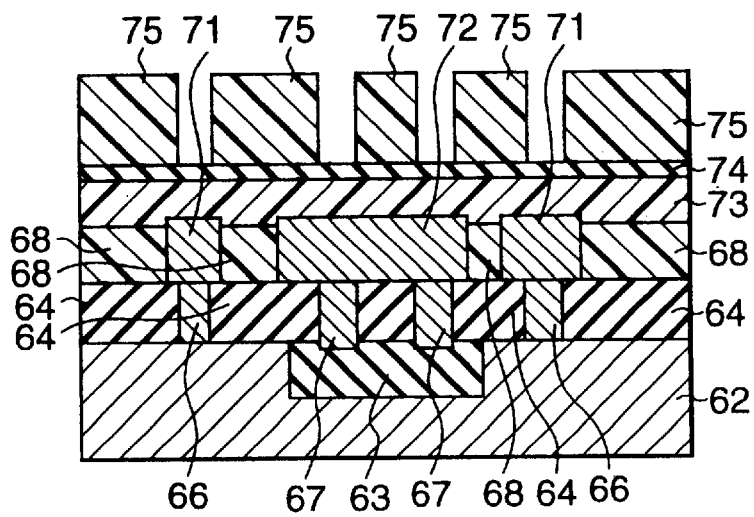

Next, the inorganic layer 74 and the second low dielectric layer 73 are etched to form the via contact holes and the dummy via contact holes and thereby obtain the state shown in FIG. 7B. The etching of the inorganic layer 74 and the second low dielectric layer 73 can be performed in the same way as the etching conditions of the inorganic layer and low dielectric layer explained above. At this time, the resist layer 75 is also simultaneously etched away.

Figure 7C:
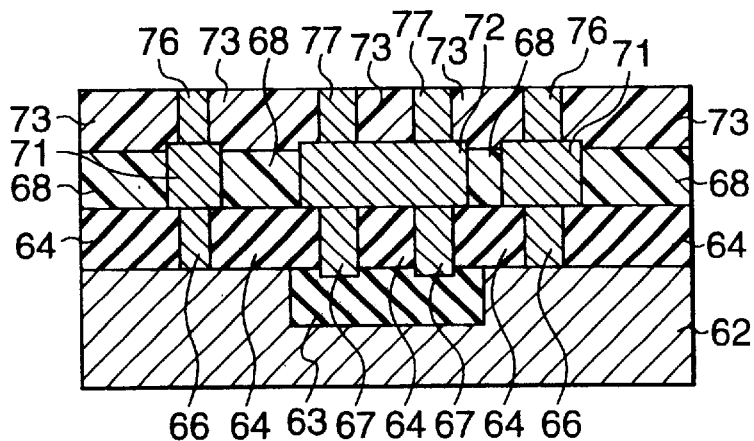

Next, a metal interconnection material such as copper is buried in the via contact holes and dummy via contact holes to form via contact plugs 74 and dummy via contact plugs 75 and thereby obtain the state shown in FIG. 7C.

Figure 7D:
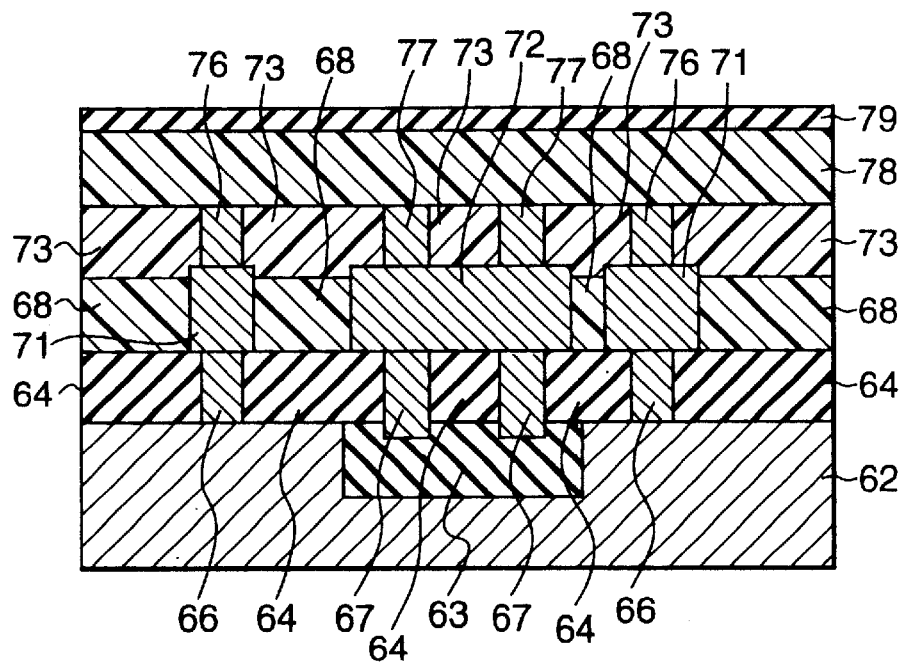

Next, a third low dielectric layer 78 is formed over the entire surface. The method of formation is similar to that of the second low dielectric layer. Further, an inorganic layer 79 such as silicon oxide, silicon oxynitride, and silicon nitride is formed on the third low dielectric layer 78 to thereby obtain the state shown in FIG. 7D. The layer can be generally formed by using a CVD system, but can also be formed using an SOG coater, vacuum evaporation, or sputtering system. This inorganic layer 79 acts as a stopper when smoothing the interconnections by CMP.

Figure 7E:
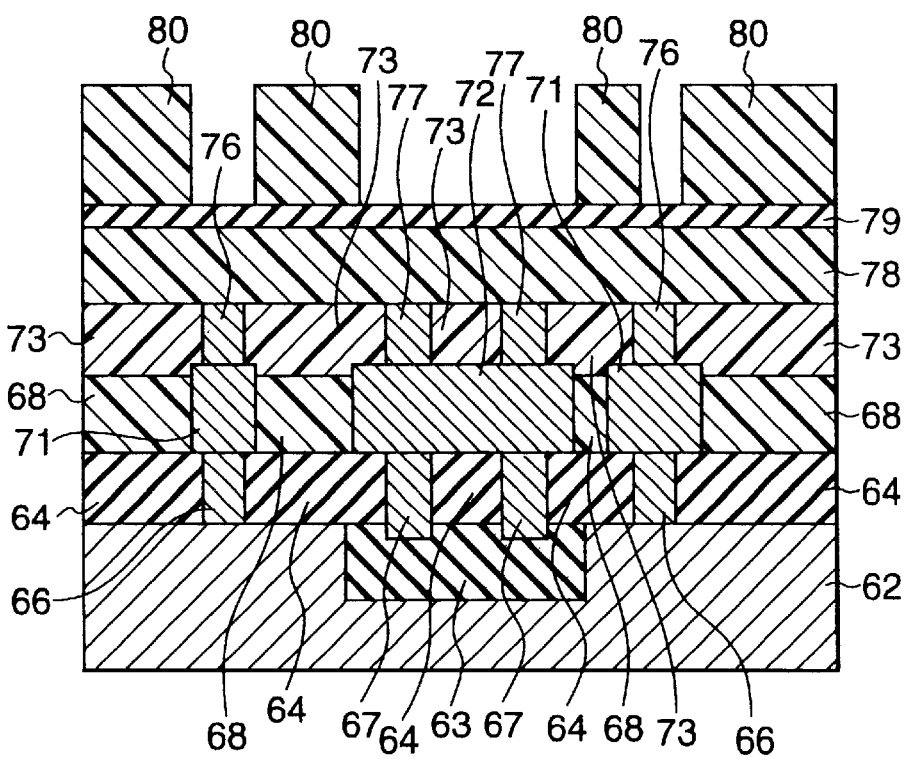

Next, as shown in FIG. 7E, a resist layer 80 is formed over the entire surface, then patterning is performed for forming the interconnections and dummy interconnections. The dummy interconnections are preferably formed at locations of interconnection spaces giving at least the minimum pitch. This is so that when designing the dummy pattern by the smallest design dimensions, the space between dummy interconnections and interconnections becomes at least the minimum pitch. Note that when stressing performance, it is more preferable to make this distance at least two times the minimum space. By making the interconnection space at least two times, the capacitance between interconnections can be roughly halved.

Next, a general magnetron reactive ion etching system is used to etch the topmost inorganic layer 77 and the lower third low dielectric layer 78. The etching may, for example, in the case of a low dielectric layer, be performed using 5 sccm of $CHF_3$, 50 sccm of $O_2$, and 200 sccm of He gas, an RF power of 1500 W, and a temperature of −10° C. Further, in the case of an inorganic layer (silicon oxide layer), the etching may be performed using 14 sccm of $C_2F_6$, 180 sccm of CO, 240 sccm of argon, and 6 sccm Of $O_2$ gas and an RF power of 1500 W.

In this case, the upper inorganic layer 79 also serves as a mask when etching the third low dielectric layer 78. Namely, the resist layer 80 is also simultaneously etched under conditions where the third low dielectric layer is etched. Note that in this embodiment, a silicon oxide or other inorganic layer was used, but it is also possible to use a metal layer of TiN, TiON, TaN, TaO, TaON, WN, W, Ti, etc.

Further, at this time, it is also possible not to pattern the dummy contacts, but to form the interconnections, then perform the patterning for forming the dummy contact holes and then form a highly heat conductive silicon oxide, silicon nitride, and silicon oxynitride, or other layer.

Next, the interconnections 81 and the dummy interconnections 82 are formed by the damascene method. That is, as the interconnection material (metal), for example, copper is formed by a sputtering system or CVD system, then the excess metal is removed by CMP. Finally, about 50 nm of the inorganic layer 79 is removed by CMP again. The inorganic layer is polished again both to completely polish off the excess metal and to remove scratches in the inorganic layer (silicon oxide layer).

Figure 7F:
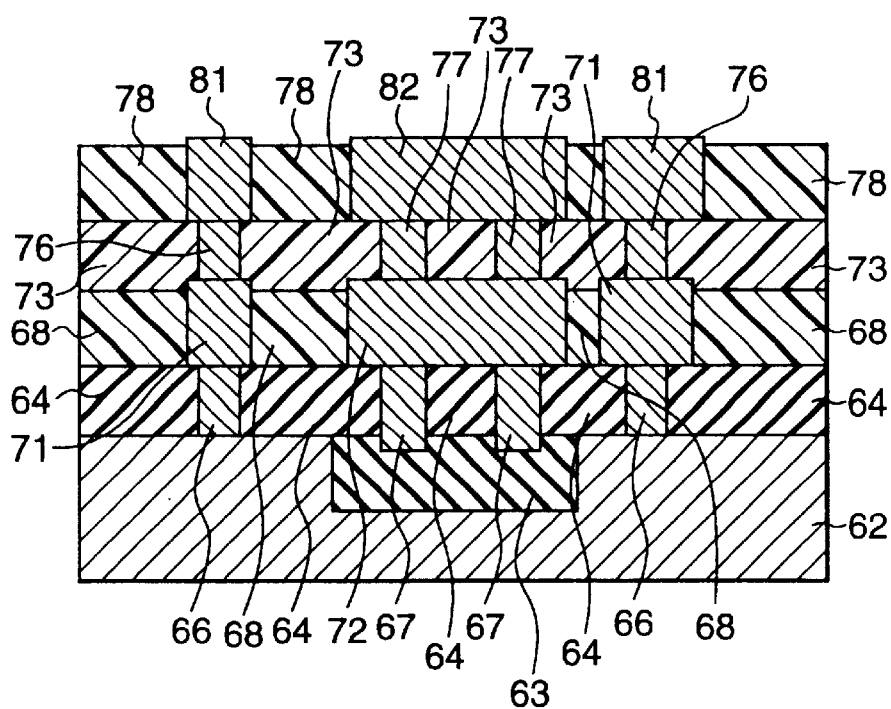

In the above way, it is possible to form a multilayer interconnection structure as shown in FIG. 7F which has two layers of interconnections, a dummy interconnection layer, contact holes, and dummy contact holes. At this time, the upper surfaces of the interconnections 81 and dummy interconnections 82 are formed higher than the height of the upper surface of the third low dielectric layer 78.

Note that by repeating the above procedure, it is possible to similarly form a three or more layer multilayer interconnection structure.

The interconnection structure obtained in the above way has dummy contact plugs in addition to dummy interconnections, so is further enhanced in heat dispersion effect. Accordingly, it is possible to obtain a semiconductor device having a highly reliable multilayer interconnectoin structure.

Note that in the above embodiment, the example was shown of performing the patterning for forming the dummy interconnections or dummy contact holes simultaneously with the patterning for forming the interconnections or contact holes (contact holes or via contact holes). In the present invention, it is also possible to form the interconnections or contact holes and then form the dummy interconnections or dummy contact holes.

Figure 8A:
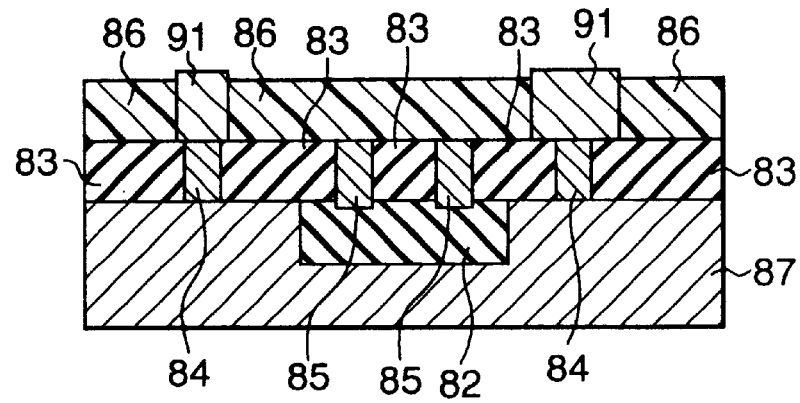
Figure 8B:
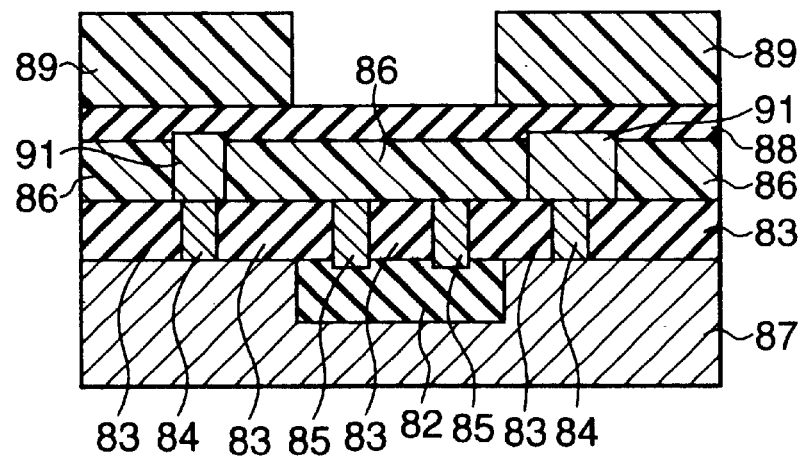

For example, it is possible to form the dummy interconnections after forming the interconnections as follows:

First, as shown in FIG. 8A, a structure forming the contact plugs 85 and interconnections 84 is obtained, then, as shown in FIG. 8B, an inorganic layer 89 such as a silicon oxide layer is formed over the entire surface, then a resist layer 89 is formed and patterning is performed for forming the dummy interconnections.

Next, a general magnetron reactive ion etching system is used for etching the inorganic layer 89 using for example 14 sscm of $C_2F_6$, 180 sccm of CO, 240 sccm of argon, and 6 sccm of $O_2$ and an RF power of 1500 W. Further, the dielectric layer (dielectric organic layer) 86 is etched using 5 sccm of $CHF_3$, 50 sccm of $O_2$, and 200 sccm of He gas, an RF power of 500 W, and a temperature of −10° C.

Figure 8C:
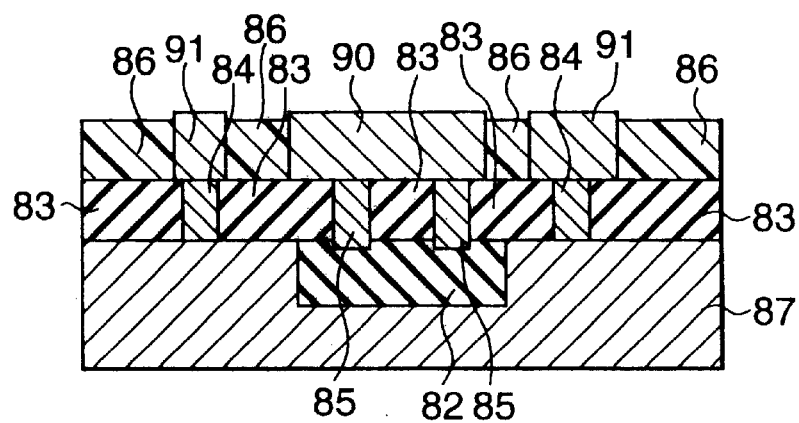
Figure 9:
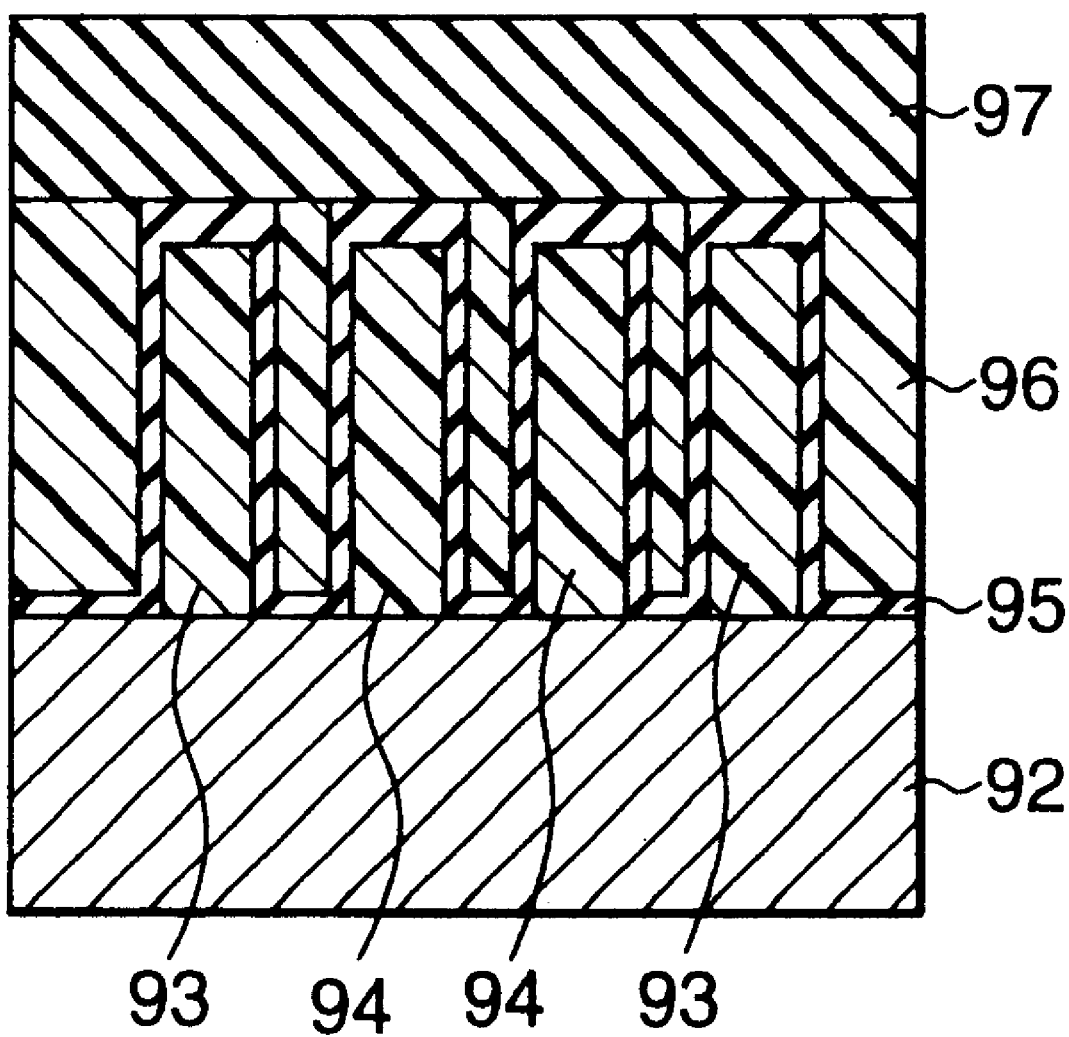
FIG. 9 is a cross-sectional view of a known semiconductor device which has metal leads and dummy leads.

Next, the dummy pattern is buried by forming a silicon oxide, silicon nitride, or silicon oxynitride layer using CVD or an SOG coater. Silicon oxide, silicon nitride, and silicon oxynitride layers have an excellent heat conductivity. Next, a CMP system for smoothing insulating layers is used to polish this using a silica based slurry or cerium oxide slurry to obtain the structure shown in FIG. 8C. In this case as well, the upper surfaces of the interconnections 84 and dummy interconnections 90 are formed higher than the upper surface of the low dielectric layer 86 by the height of the inorganic layer 88.

Note that in this embodiment, a dielectric organic layer is used as a low dielectric layer, but when using xerogel as well, a structure exhibiting the desired effects of the present invention can be obtained. As the etching conditions at this time, the same can be used as the etching conditions of the inorganic layer.

As explained in detail above, a semiconductor device of the present invention is greatly reduced in the increase in capacitance between interconnections due to the use of a dielectric film having a dielectric constant of not more than 3.0 as the inter-layer insulating layer.

Further, by providing dummy interconnections for heat dispersion at portions of interconnection spaces of at least three times the pitch in the interconnection pattern, it is possible to effectively prevent the reduction in the heat dispersion effect due to the use of a low dielectric layer with a small heat conductivity.

In addition, when providing dummy contact plugs (contact plugs and via contact plugs) under the dummy interconnections, it is possible to effectively prevent the reduction in the heat dispersion efficiency due to the use of a low dielectric layer having a small heat conductivity.

Further, according to the present invention, by using a layer containing xerogel with an extremely small dielectric constant around the interconnections (left and right of interconnections), preferably at locations of interconnection spaces of not more than three times the standard pitch and by using a low dielectric layer around the contact holes connecting interconnections (above and below interconnections), it is possible to make up for the defects of xerogel layers and greatly reduce the capacitance between interconnections and thereby manufacture a semiconductor device having a highly reliable miniature structure.

Further, by providing layers comprised of a silane coupling agent above and below the layer containing xerogel, it is possible to manufacture a semiconductor device with an excellent inter-layer adhesion.

While the invention has been described by reference to specific embodiments chosen for purposes of illustration, it should be apparent that numerous modifications could be made thereto by those skilled in the art without departing from the basic concept and scope of the invention.

What is claimed is:

1. A semiconductor device comprising:
   a semiconductor substrate;
   an insulating layer formed on the substrate;
   a first dielectric layer formed on the insulating layer and having a dielectric constant of not more than 3.0; and
   an interconnection layer formed in the first dielectric layer and contacting the insulating layer and extending with a substantially uniform composition to an upper surface that is formed higher than an upper surface of the first dielectric layer.

2. A semiconductor device as set forth in claim 1, further comprising a second dielectric layer formed on the interconnection layer and the first dielectric layer and having a dielectric constant of at least 3.0.

3. A semiconductor device as set forth in claim 1, wherein the first dielectric layer comprises at least one material selected from the group comprising a cyclic fluororesin, polytetrafluoroethylene, fluorinated ethylene propylene, a copolymer of tetrafluoroethylene and perfluoroalkoxyethylene, polyfluorovinylidene, polytrifluorochloroethylene, a fluoroaryl ether resin, polyfluoroimide, benzocyclobutene (BCB) polymer, polyimide, amorphous carbon, a monomethyltrihydroxysilane (organic SOG) condensate, a polymer having a repeating structural unit in its molecule of:

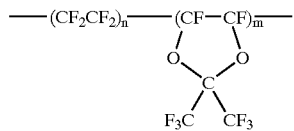

where, m and n represents a natural number,
a polymer having a repeating structural unit in its molecule of

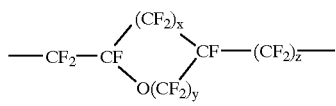

where, x, y and z each represents a natural number,
a polymer having a repeating structural unit in its molecule of

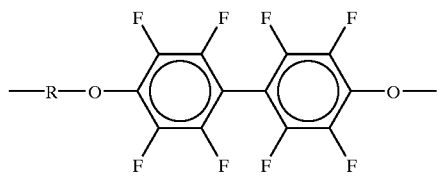

where, R represents an alkylene or a phenylene group, and a polymer having a repeating structural unit in its molecule of

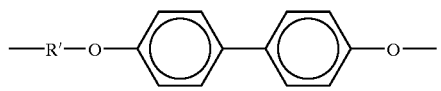

where, R' represents an alkylene or a phenylene group.

4. A semiconductor device as set forth in claim 2, wherein the second dielectric layer comprises at least one material selected from the group comprising a cyclic fluororesin, polytetrafluoroethylene, fluorinated ethylene propylene, a copolymer of tetrafluoroethylene and perfluoroalkoxyethylene, polyfluorovinylidene, polytrifluorochloroethylene, a fluoroaryl ether resin, polyfluoroimide, benzocyclobutene (BCB) polymer, polyimide, amorphous carbon, a monomethyltrihydroxysilane (organic SOG) condensate, a polymer having a repeating structural unit in its molecule of:

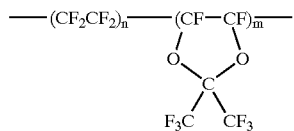

where, m and n each represents a natural number,
a polymer having a repeating structural unit in its molecule of

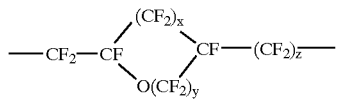

where, x, y and z each represents a natural number,
a polymer having a repeating structural unit in its molecule of

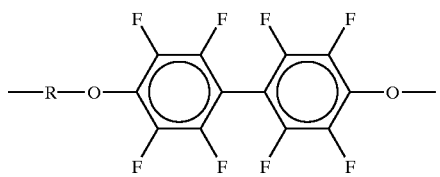

where, R represents an alkylene or a phenylene group, and a polymer having a repeating structural unit in its molecule of

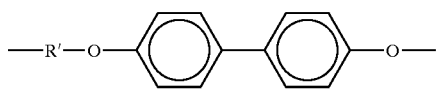

where, R' represents an alkylene or a phenylene group.

5. A semiconductor device as set forth in claim 1, further comprising a dummy interconnection in the first dielectric layer in a portion of an interconnection space of at least three times a pitch in an interconnection pattern.

6. A semiconductor device as set forth in claim 5, wherein the dummy interconnection is formed in the portion of an interconnection space of at least three times the pitch so that all the interconnection spaces becomes less than 1 μm.

7. A semiconductor device as set forth in claim 5, further comprising a dummy contact hole formed in the insulating layer under the dummy interconnection and not connected with a lower conductive layer.

8. A semiconductor device comprising:
a semiconductor substrate;
an insulating layer formed on the substrate;
a layer containing xerogel on the insulating layer; and
an interconnection layer formed in the layer containing xerogel and contacting the insulating layer and extending with a substantially uniform composition higher than an upper surface of the layer containing xerogel.

9. A semiconductor device as set forth in claim 8, further comprising a dummy interconnection in the layer containing xerogel in a portion of an interconnection space of at least three times a pitch in an interconnection pattern.

10. A semiconductor device as set forth in claim 9, wherein the dummy interconnection is formed in the portion of an interconnection space of at least three times the pitch so that all the interconnection spaces becomes less than 1 μm.

11. A semiconductor device as set forth in claim 9, further comprising a dummy contact hole formed in the insulating layer under the dummy interconnection and not connected with a lower conductive layer.

12. A semiconductor device as set forth in claim 8, further comprising a layer containing a silane coupling agent in contact with the layer containing xerogel.

13. A semiconductor device as set forth in claim 8, wherein the layer containing xerogel is formed on the insulating layer at a portion of an interconnection space of at least three times a pitch in an interconnection pattern.

14. A semiconductor device comprising:

a semiconductor substrate;

an insulating layer formed on the substrate;

a first non-xerogel dielectric layer formed on the insulating layer and having a dielectric constant of not more than 3.0;

a layer containing xerogel on the first dielectric layer;

a second non-xerogel dielectric layer formed on the layer containing xerogel and having a dielectric constant of not more than 3.0; and an interconnection layer formed in the layer containing xerogel and contacting the insulating layer.

15. A semiconductor device as set forth in claim 14, wherein an upper surface of the interconnection layer is formed higher than an upper surface of the layer containing xerogel.

16. A semiconductor device as set forth in claim 14, further comprising a contact hole formed in the second dielectric layer having a dielectric constant of not more than 3.0 for connecting interconnections.

17. A semiconductor device as set forth in claim 14, further comprising a dummy interconnection in the layer containing xerogel in a portion of an interconnection space of at least three times a pitch in an interconnection pattern.

18. A semiconductor device as set forth in claim 17, wherein the dummy interconnection is formed in the portion of an interconnection space of at least three times the pitch so that all the interconnection spaces becomes less than 1 $\mu$m.

19. A semiconductor device as set forth in claim 14, further comprising a dummy contact hole formed in the insulating layer under the dummy interconnection and not connected with a lower conductive layer.

20. A semiconductor device as set forth in claim 14, further comprising a layer containing a silane coupling agent in contact with the layer containing xerogel.

* * * * *